United States Patent
Behel et al.

(10) Patent No.: US 10,305,495 B2
(45) Date of Patent: May 28, 2019

(54) PHASE CONTROL OF CLOCK SIGNAL BASED ON FEEDBACK

(71) Applicant: Analog Devices, Inc., Norwood, MA (US)

(72) Inventors: John Kevin Behel, Greensboro, NC (US); Reuben Pascal Nelson, Colfax, NC (US); Matthew D. McShea, Summerfield, NC (US); Matthew Louis Courcy, Fremont, NH (US); Kenny Gentile, Burlington, NC (US); Carroll C. Speir, Pleasant Garden, NC (US)

(73) Assignee: Analog Devices, Inc., Norwood, MA (US)

( * ) Notice: Subject to any disclaimer, the term of this patent is extended or adjusted under 35 U.S.C. 154(b) by 93 days.

(21) Appl. No.: 15/287,435

(22) Filed: Oct. 6, 2016

(65) Prior Publication Data
US 2018/0102779 A1  Apr. 12, 2018

(51) Int. Cl.
*H03K 5/00* (2006.01)
*H03L 7/087* (2006.01)
(Continued)

(52) U.S. Cl.
CPC ........... *H03L 7/087* (2013.01); *H03K 5/1508* (2013.01); *H03L 7/06* (2013.01); *H03L 7/0814* (2013.01); *H04L 7/02* (2013.01)

(58) Field of Classification Search
CPC ..... H04J 3/0682; H04J 3/0638; H04L 1/0026; H04L 1/0003; H04L 7/0274;
(Continued)

(56) References Cited

U.S. PATENT DOCUMENTS 4,888,764 A * 12/1989 Haug ...................... H04L 12/40
375/219
5,537,068 A * 7/1996 Konno ...................... G06F 1/08
327/115
(Continued)

FOREIGN PATENT DOCUMENTS

| EP | 1575170 | 9/2005 |
|---|---|---|
| EP | 3035536 | 6/2016 |
| WO | WO2016058344 | 4/2016 |

OTHER PUBLICATIONS

Altera, "JESD204B IP Core User Guide," Dec. 15, 2014, 137 pages. Available at: https://www.altera.com/en_US/pdfs/literature/ug/archives/ug-jesd204b-14.1.pdf (accessed Nov. 9, 2016).
(Continued)

*Primary Examiner* — James M Perez
(74) *Attorney, Agent, or Firm* — Knobbe, Martens, Olson & Bear, LLP

(57) ABSTRACT

Aspects of this disclosure relate to adjusting a phase of a clock signal provided to a device based on a feedback signal from the device. The feedback signal can provide phase information associated with the device and/or other information associated with the device, such as temperature information. A feedback signal processor can compute a phase control signal based on the feedback signal. The phase control signal can be used to adjust the phase of the clock signal. By adjusting the phase of one or more clock signals, several devices, such as data converters, can be synchronized.

22 Claims, 21 Drawing Sheets

(51) Int. Cl.
*H03K 5/15* (2006.01)
*H03L 7/081* (2006.01)
*H04L 7/02* (2006.01)
*H03L 7/06* (2006.01)

(58) Field of Classification Search
CPC ... H04L 7/0331; H04L 7/0337; H04B 7/2048; H03D 2200/005; H03D 220/0052; H03K 5/00
USPC .................................................. 375/354–376
See application file for complete search history.

(56) References Cited

U.S. PATENT DOCUMENTS

| | | | | |
|---|---|---|---|---|
| 5,828,250 A * | | 10/1998 | Konno | G06F 1/08 327/116 |
| 6,107,948 A * | | 8/2000 | Scott | H04B 14/062 341/143 |
| 6,150,859 A * | | 11/2000 | Park | H03L 7/0814 327/149 |
| 6,509,773 B2 * | | 1/2003 | Buchwald | H03L 7/0814 327/248 |
| 6,643,787 B1 * | | 11/2003 | Zerbe | G06F 1/10 713/400 |
| 6,768,358 B2 * | | 7/2004 | Birk | G06F 1/04 327/156 |
| 6,812,771 B1 * | | 11/2004 | Behel | H03F 1/22 327/356 |
| 6,885,227 B2 * | | 4/2005 | Agrawal | H03L 7/0891 327/156 |
| 6,922,436 B1 * | | 7/2005 | Porat | H03M 1/66 375/222 |
| 6,956,416 B2 * | | 10/2005 | Wilson | H03L 3/00 327/156 |
| 6,987,823 B1 * | | 1/2006 | Stark | G11C 7/1003 327/141 |
| 7,019,577 B2 * | | 3/2006 | Agrawal | G06F 1/08 327/291 |
| 7,058,150 B2 * | | 6/2006 | Buchwald | H03L 7/0814 370/307 |
| 7,272,526 B2 * | | 9/2007 | Stern | G01R 31/3191 327/161 |
| 7,352,831 B2 * | | 4/2008 | Quinlan | H04L 27/156 375/344 |
| 7,356,107 B2 * | | 4/2008 | Xiu | H03L 7/00 375/355 |
| 7,657,773 B1 * | | 2/2010 | Chandra | G06F 1/10 327/295 |
| 7,697,647 B1 * | | 4/2010 | McShea | H03L 7/087 375/354 |
| 7,702,004 B2 * | | 4/2010 | Deas | H04B 1/58 370/286 |
| 7,822,111 B2 * | | 10/2010 | Sohn | H04L 25/03038 375/231 |
| 7,826,579 B2 * | | 11/2010 | Hwang | H03L 7/06 375/354 |
| 7,859,344 B2 * | | 12/2010 | Uozumi | H03K 5/135 327/156 |
| 7,885,367 B2 * | | 2/2011 | Nishimura | H04L 7/048 327/144 |
| 8,050,373 B2 * | | 11/2011 | Buchwald | H04L 25/20 327/147 |
| 8,139,702 B1 * | | 3/2012 | Fortin | H03L 7/0814 375/354 |
| 8,170,157 B2 * | | 5/2012 | Menolfi | H03L 7/07 327/291 |
| 8,259,891 B2 * | | 9/2012 | Miller | H03L 7/107 375/376 |
| 8,295,419 B2 * | | 10/2012 | Hwang | H03L 7/06 375/354 |
| 8,391,436 B2 * | | 3/2013 | Higeta | H03K 5/1534 375/317 |
| 8,520,787 B2 * | | 8/2013 | Hennedy | H04L 25/14 327/141 |
| 8,526,554 B2 * | | 9/2013 | Hennedy | H04L 25/4908 327/141 |
| 8,542,779 B2 * | | 9/2013 | Xu | H04L 27/2272 331/2 |
| 8,634,503 B2 * | | 1/2014 | Misek | H04L 7/0337 327/141 |
| 8,643,414 B1 * | | 2/2014 | Navid | H03L 7/10 327/147 |
| 8,824,615 B2 * | | 9/2014 | Lin | H04L 7/0331 327/147 |
| 8,836,394 B2 * | | 9/2014 | Zerbe | H04L 7/0079 327/161 |
| 8,917,996 B2 * | | 12/2014 | Belansky | H04Q 9/00 398/116 |
| 8,942,334 B1 * | | 1/2015 | Zortea | H04L 7/0334 375/355 |
| 8,958,504 B2 * | | 2/2015 | Warke | H04L 27/0014 375/235 |
| 8,989,249 B2 * | | 3/2015 | Zerbe | H04L 1/0026 375/229 |
| 9,112,517 B1 * | | 8/2015 | Lye | H03L 7/087 |
| 9,184,909 B1 * | | 11/2015 | McCracken | H04L 7/042 |
| 9,264,102 B2 * | | 2/2016 | Cheung | H04L 25/03885 |
| 9,329,623 B2 * | | 5/2016 | Vankayala | G06F 1/12 |
| 9,378,843 B1 * | | 6/2016 | Hossain | H03L 7/00 |
| 9,461,654 B1 * | | 10/2016 | Kou | H03L 7/0807 |
| 9,503,250 B2 * | | 11/2016 | Van Rens | H04L 7/02 |
| 9,565,036 B2 * | | 2/2017 | Zerbe | H04L 25/0264 |
| 9,596,073 B1 * | | 3/2017 | Reyes | H04L 7/0037 |
| 9,628,262 B1 * | | 4/2017 | Moe | H04L 7/0331 |
| 9,647,830 B2 * | | 5/2017 | Sai | H04L 7/0332 |
| 9,673,910 B1 * | | 6/2017 | Crivelli | H04B 10/6162 |
| 9,722,537 B2 * | | 8/2017 | Vlachogiannakis | H03B 5/1265 |
| 9,742,416 B2 * | | 8/2017 | Prathapan | H03L 7/091 |
| 9,742,549 B1 * | | 8/2017 | Wang | H04J 3/0647 |
| 9,749,123 B1 * | | 8/2017 | Zhou | H04B 10/11 |
| 9,793,910 B1 * | | 10/2017 | Devarajan | H03M 1/0634 |
| 9,838,026 B2 * | | 12/2017 | Van Brunt | H03L 7/091 |
| 9,853,649 B2 * | | 12/2017 | Staszewski | G06F 9/30032 |
| 9,853,807 B2 * | | 12/2017 | Tsai | H03L 7/0994 |
| 9,866,224 B2 * | | 1/2018 | Kondo | H03L 7/099 |
| 9,871,504 B2 * | | 1/2018 | Clara | H03K 5/13 |
| 9,893,734 B1 * | | 2/2018 | Chillara | H03L 7/22 |
| 9,893,876 B2 * | | 2/2018 | Moehlmann | H03L 7/093 |
| 2002/0034222 A1 * | | 3/2002 | Buchwald | H03L 7/0814 375/232 |
| 2002/0039394 A1 * | | 4/2002 | Buchwald | H03L 7/0814 375/355 |
| 2002/0080898 A1 * | | 6/2002 | Agazzi | H03M 1/0624 375/355 |
| 2002/0131538 A1 * | | 9/2002 | Staszewski | H03L 7/085 375/355 |
| 2002/0150116 A1 * | | 10/2002 | Huang | H04B 3/548 370/431 |
| 2003/0035503 A1 * | | 2/2003 | Sanduleanu | H03L 7/07 375/376 |
| 2004/0059396 A1 * | | 3/2004 | Reinke | A61N 1/025 607/60 |
| 2004/0109496 A1 * | | 6/2004 | Deas | H04B 1/58 375/220 |
| 2004/0122490 A1 * | | 6/2004 | Reinke | A61N 1/025 607/60 |
| 2005/0093854 A1 * | | 5/2005 | Kennedy | G06F 3/1423 345/213 |
| 2005/0094757 A1 * | | 5/2005 | Meninger | H03L 7/087 375/376 |
| 2005/0099208 A1 * | | 5/2005 | Ishihara | G06F 1/12 327/2 |
| 2005/0110515 A1 * | | 5/2005 | Ju | G01R 19/0053 326/14 |
| 2005/0200390 A1 * | | 9/2005 | Starr | H03L 7/081 327/156 |
| 2006/0033582 A1 * | | 2/2006 | Staszewski | H03L 7/085 331/16 |

(56) References Cited

U.S. PATENT DOCUMENTS

| | | | | |
|---|---|---|---|---|
| 2006/0061501 | A1* | 3/2006 | Sheng | H03M 1/1014 341/155 |
| 2007/0085622 | A1* | 4/2007 | Wallberg | H03L 7/093 331/179 |
| 2007/0086267 | A1* | 4/2007 | Kwak | G11C 7/02 365/233.1 |
| 2007/0126513 | A1* | 6/2007 | Lee | G01R 31/31725 331/16 |
| 2007/0152727 | A1* | 7/2007 | Lee | G06F 1/04 327/291 |
| 2007/0194969 | A1* | 8/2007 | Bucklen | H03M 1/1245 341/155 |
| 2008/0055009 | A1* | 3/2008 | Lerner | H03B 21/00 331/37 |
| 2008/0068236 | A1* | 3/2008 | Sheba | G04F 10/005 341/118 |
| 2008/0163007 | A1* | 7/2008 | Shaeffer | G06F 11/1004 714/52 |
| 2008/0205571 | A1* | 8/2008 | Muhammad | H04L 27/361 375/376 |
| 2009/0015304 | A1* | 1/2009 | Yin | H03L 7/06 327/162 |
| 2009/0055678 | A1* | 2/2009 | Kummaraguntla | G06F 1/04 713/600 |
| 2009/0062880 | A1* | 3/2009 | Li | A61N 1/025 607/32 |
| 2009/0074125 | A1* | 3/2009 | Lin | H03L 7/087 375/375 |
| 2009/0174492 | A1* | 7/2009 | Zhang | H03L 7/085 331/1 R |
| 2009/0251225 | A1* | 10/2009 | Chen | H03K 3/03 331/1 A |
| 2009/0275358 | A1* | 11/2009 | Feltgen | H03C 3/0925 455/550.1 |
| 2010/0073210 | A1* | 3/2010 | Bardsley | H03M 1/0641 341/131 |
| 2010/0135100 | A1* | 6/2010 | Chiu | G11C 7/1072 365/233.11 |
| 2010/0182060 | A1* | 7/2010 | Fujino | H03L 7/085 327/159 |
| 2010/0226330 | A1* | 9/2010 | Haque | H03M 1/1215 370/329 |
| 2010/0244914 | A1* | 9/2010 | Kim | H03L 7/085 327/157 |
| 2010/0283532 | A1* | 11/2010 | Horan | G09G 5/003 327/530 |
| 2011/0032013 | A1* | 2/2011 | Nelson | B60Q 1/444 327/156 |
| 2011/0133799 | A1* | 6/2011 | Dunworth | H03L 7/089 327/157 |
| 2011/0142112 | A1* | 6/2011 | Lin | H04L 7/0008 375/224 |
| 2011/0221486 | A1* | 9/2011 | Hirata | H03L 7/0812 327/146 |
| 2011/0239031 | A1* | 9/2011 | Ware | G11C 7/04 713/500 |
| 2011/0249718 | A1* | 10/2011 | Zerbe | H03L 7/07 375/226 |
| 2011/0293041 | A1* | 12/2011 | Luo | H04L 5/20 375/316 |
| 2011/0298508 | A1* | 12/2011 | Wu | H04L 7/0337 327/157 |
| 2012/0013406 | A1* | 1/2012 | Zhu | H03L 7/0992 331/34 |
| 2012/0039426 | A1* | 2/2012 | Onodera | H04L 7/002 375/355 |
| 2012/0051480 | A1* | 3/2012 | Usugi | H03L 7/087 375/376 |
| 2012/0062286 | A1* | 3/2012 | Ginsburg | H03F 3/2171 327/148 |
| 2012/0087452 | A1* | 4/2012 | Zerbe | H04L 25/0264 375/354 |
| 2012/0124258 | A1* | 5/2012 | Tailliet | G06F 13/4295 710/106 |
| 2012/0176169 | A1* | 7/2012 | Sinha | H03L 7/1075 327/156 |
| 2012/0252382 | A1* | 10/2012 | Bashir | H03F 3/217 455/114.3 |
| 2012/0311251 | A1* | 12/2012 | Best | G06F 13/1689 711/105 |
| 2012/0319749 | A1* | 12/2012 | Thaller | H03L 7/183 327/158 |
| 2013/0034197 | A1* | 2/2013 | Aweya | H04J 3/0664 375/362 |
| 2013/0051290 | A1* | 2/2013 | Endo | H03K 23/662 370/281 |
| 2013/0060527 | A1* | 3/2013 | Martin | G01R 13/0254 702/189 |
| 2013/0121094 | A1* | 5/2013 | Zerbe | H03L 7/091 365/194 |
| 2013/0287155 | A1* | 10/2013 | Nakamizo | G06F 1/10 375/362 |
| 2014/0152356 | A1* | 6/2014 | Lin | H04L 7/0331 327/155 |
| 2014/0210525 | A1* | 7/2014 | Jenkins | H03L 7/087 327/150 |
| 2014/0333358 | A1* | 11/2014 | Kim | H03L 7/1974 327/159 |
| 2014/0336623 | A1* | 11/2014 | Van Rens | H04L 7/02 604/528 |
| 2015/0078501 | A1* | 3/2015 | Olejarz | H03L 7/0805 375/376 |
| 2015/0188697 | A1* | 7/2015 | Lin | H03L 7/085 375/375 |
| 2015/0236739 | A1* | 8/2015 | Montalvo | H03M 1/0626 455/307 |
| 2015/0263850 | A1* | 9/2015 | Asada | H03L 7/08 375/371 |
| 2015/0372682 | A1* | 12/2015 | Alexeyev | H03L 7/085 327/156 |
| 2016/0041579 | A1* | 2/2016 | Ali | G06F 1/08 713/400 |
| 2016/0065196 | A1* | 3/2016 | Fiedler | H03K 5/159 327/284 |
| 2016/0182067 | A1* | 6/2016 | Liu | H03L 7/091 327/158 |
| 2016/0182075 | A1* | 6/2016 | Devarajan | H03M 1/1019 341/120 |
| 2016/0277030 | A1* | 9/2016 | Burbano | H03K 23/40 |
| 2016/0277219 | A1* | 9/2016 | Venkatram | H04L 7/033 |
| 2016/0352506 | A1* | 12/2016 | Huang | H04L 7/0332 |
| 2017/0033918 | A1* | 2/2017 | Hossain | H04L 7/0087 |
| 2017/0170893 | A1* | 6/2017 | Sanguinetti | H04B 10/071 |
| 2017/0214513 | A1* | 7/2017 | Asada | H04L 7/0037 |
| 2017/0222795 | A1* | 8/2017 | Kuo | H04L 7/0331 |
| 2017/0235689 | A1* | 8/2017 | Yang | G06F 13/42 710/107 |
| 2017/0237419 | A1* | 8/2017 | Clara | H03K 5/13 327/231 |
| 2017/0257168 | A1* | 9/2017 | Gopalakrishnan | H04B 10/541 |
| 2018/0102779 | A1* | 4/2018 | Behel | H03K 5/1508 |
| 2018/0110018 | A1* | 4/2018 | Yu | H04B 5/0031 |
| 2018/0115406 | A1* | 4/2018 | Moore | G04F 10/005 |
| 2018/0175839 | A1* | 6/2018 | Bandi | H03K 5/14 |
| 2018/0287622 | A1* | 10/2018 | Goldberg | H03L 7/0992 |

OTHER PUBLICATIONS

Xilinx, "JESD204 V6.1: LogiCORE IP Product Guide," Apr. 1, 2015, 128 pages. Available at: http://www.xilinx.com/support/documentation/ip_documentation/jesd204/v6_1/pg066-jesd204.pdf (accessed Nov. 9, 2016).

Beavers, et al., "Clock Wideband GSPS JESD204B ADCs", dated 2015, 6 pages. Available at: http://www.analog.com/media/en/technical-documentation/technical-articles/Clocking-Wideband-GSPS-JESD204B-ADCs.pdf (accessed Nov. 9, 2016).

Foss, et al., "A Test Method for Synchronizing Multipole GSPS Converters", dated 2015, 4 pages. Available at: http://www.analog.

(56) References Cited

OTHER PUBLICATIONS com/media/en/technical-documentation/technical-articles/A-Test-Method-for-Synchronizing-Multiple-GSPS-Converters.pdf (accessed Nov. 9, 2016).
Analog Devices, "JESD204B Survival Guide", dated 2014, 78 pages. Available at: http://www.analog.com/media/en/technical-documentation/technical-articles/JESD204B-Survival-Guide.pdf (accessed Nov. 9, 2016).
Extended European Search Report dated Feb. 18, 2018 for European Patent Application No. 17194770.8.

* cited by examiner

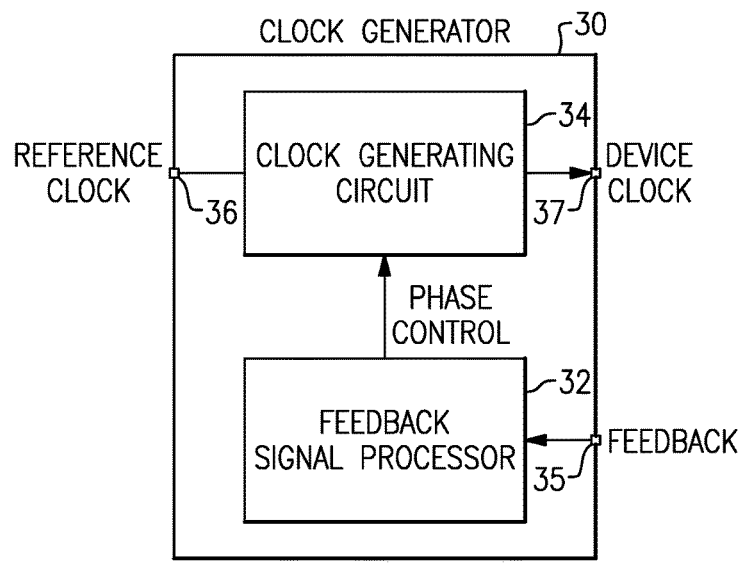
FIG.3
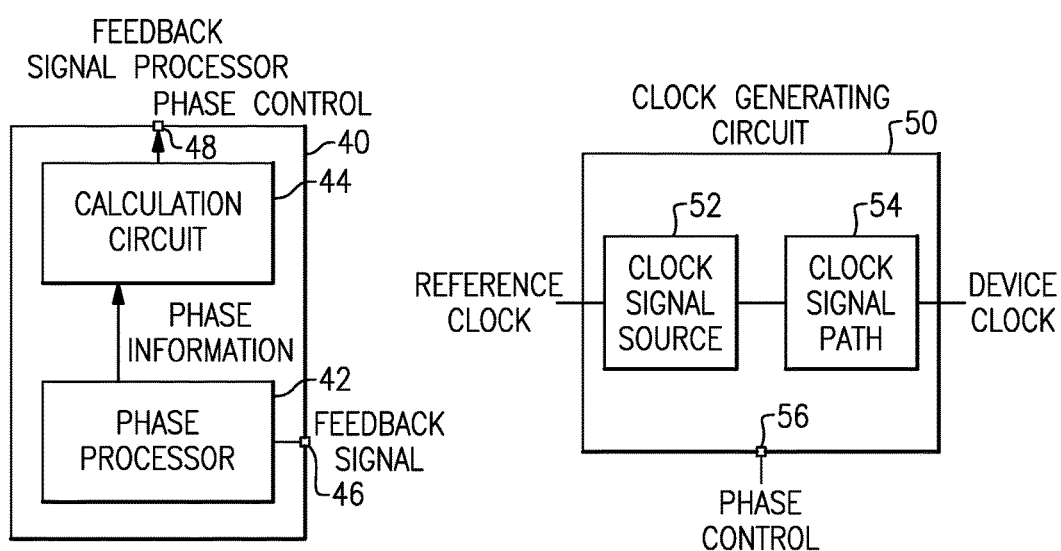
FIG.4
FIG.5

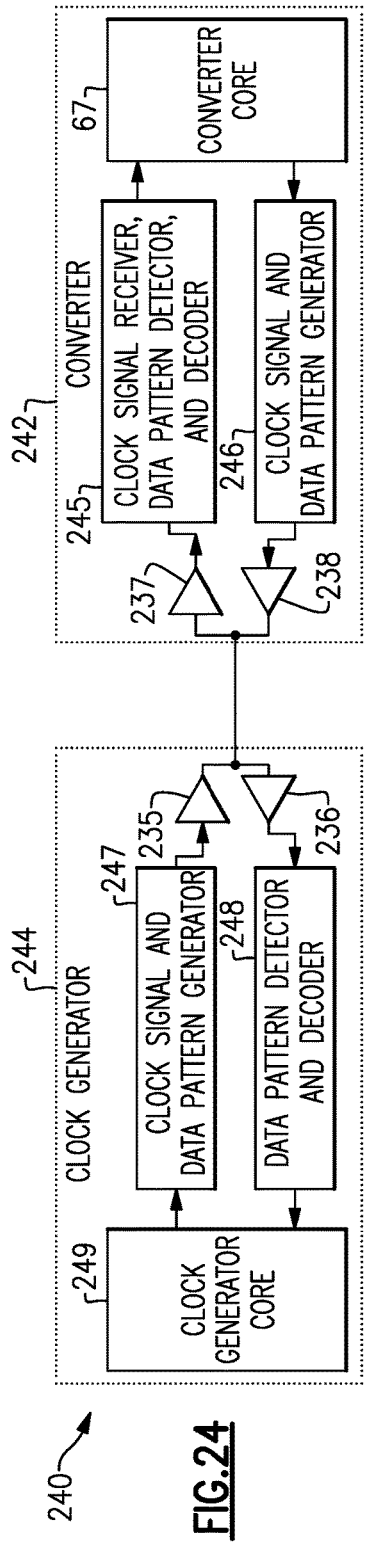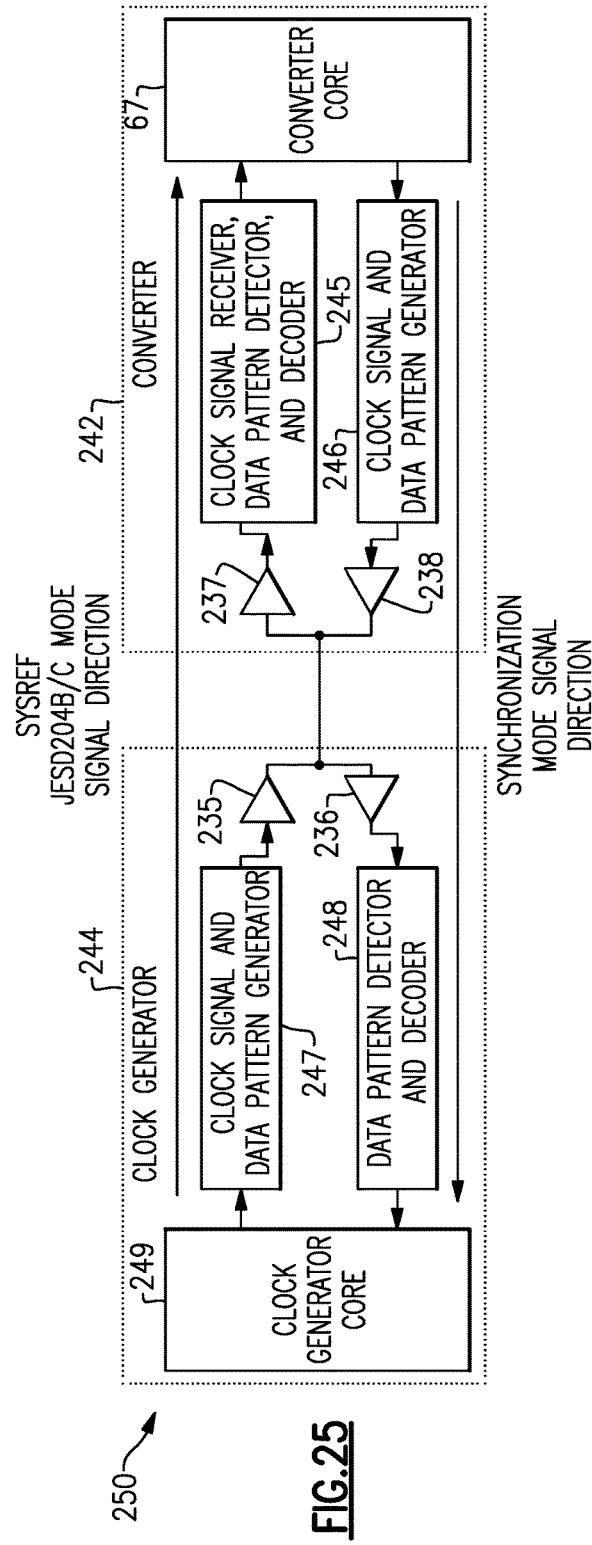

PHASE CONTROL OF CLOCK SIGNAL BASED ON FEEDBACK

FIELD OF DISCLOSURE

The present disclosure relates to adjusting a phase of a clock signal in an electronic system.

BACKGROUND

Certain electronic systems can include a clock generator configured to provide device clock signals to different data converters (e.g., digital-to-analog converters or analog-to-digital converters) and/or other devices. The clock signals can be provided to devices in accordance with a JESD204 standard, such as JESD204B or JESD204C.

It can be desirable to keep the phase of certain signals of different data converters synchronized. A phase mismatch between certain signals of the data converters can be a limiting factor in system performance, such as in extending an amount of time between calibrations of a wireless system.

SUMMARY OF THE DISCLOSURE

The innovations described in the claims each have several aspects, no single one of which is solely responsible for its desirable attributes. Without limiting the scope of the claims, some prominent features of this disclosure will now be briefly described.

One aspect of this disclosure is a system with clock signal phase adjustment. The system includes a device configured to receive a clock signal and to provide a feedback signal, in which a phase associated with the device is based on the clock signal. The system also includes a clock generator configured to provide the clock signal. The clock generator includes a feedback signal processor and a clock generating circuit. The feedback signal processor is configured to receive the feedback signal from the device and to compute a phase control signal based on the feedback signal. The clock generating circuit is configured to adjust the phase of the clock signal based on the phase control signal.

The feedback signal can include information indicative of the phase associated with the device. The feedback signal processor can include a phase processor and a calculation circuit. The phase processor can generate a digital signal indicative of the phase associated with the device based on the feedback signal. The calculation circuit can compute the phase control signal based on the digital signal. The phase processor can include a time-to-digital converter.

The system can further include a second device configured to receive a second clock signal from the clock generator, in which the clock generator is further configured to receive a second feedback signal from the second device and to adjust a phase of the second clock signal based on the second feedback signal.

The system can further include a second device configured to receive a second clock signal from the clock generator and to provide a second feedback signal to the clock generator, in which the feedback signal processor comprises a calculation circuit configured to compute the phase control signal based on the feedback signal and the second feedback signal.

The system can further include three other devices configured to receive respective clock signals from the clock generator and to provide respective feedback signals to the clock generator, in which the clock generator is configured to adjust a phase of the respective clock signal of at least one of the three other devices based on the feedback signal from another of the three other devices.

The clock signal can be a device clock signal. The clock generator can include a bi-directional interface configured to receive the feedback signal from the device and to provide a system reference signal to the device.

The device can include a data converter. The clock signal can be a device clock signal. The clock generator can provide a system reference signal to the device.

The feedback signal can include data information associated with the device. The feedback signal processor can include a calculation circuit configured to compute the phase control signal based on information indicative of temperature.

The clock generating circuit can include a phase-locked loop configured to receive the phase control signal and to adjust the phase of the clock signal. Alternatively or additionally, the clock generating circuit can include a clock signal path configured to receive the phase control signal and to adjust a delay in the clock signal path to adjust the phase of the clock signal.

Another aspect of this disclosure is a feedback signal processor for providing a phase control signal for adjusting a phase of a clock signal. The feedback signal processor includes a phase processor and a calculation circuit. The phase processor is configured to receive a feedback signal generated by a device that is configured to receive a clock signal. The phase processor is also configured to generate a digital signal indicative of a phase associated with the device based on the feedback signal, in which the phase associated with the device depends on the clock signal. The calculation circuit is configured to compute a phase control signal based on the digital signal and to output the phase control signal for adjusting the phase of the clock signal.

The phase processor can include a time-to-digital converter.

The calculation circuit can compute the phase control signal based on additional information. The additional information can include at least one of temperature information or information associated with another feedback signal from another device.

A clock generator can include the feedback signal processor and a clock generating circuit configured to adjust the phase of the clock signal and to output the clock signal with the adjusted phase to the device. The device can be a data converter, and the clock generator can output a second clock signal to a second data converter and provide a system reference signal that is source synchronous with the second clock signal to the second device. The clock generator can provide other clock signals to other devices and to adjust a phase of at least one of the other clock signals based on feedback from at least one of the other devices.

Another aspect of this disclosure is a clock generator with clock signal phase adjustment. The clock generator includes means for generating a phase control signal based on feedback from a device configured to receive a clock signal from the clock generator. The clock generator also includes a clock generating circuit configured to generate the clock signal, adjust a phase of the clock signal based on the phase control signal, and output the clock signal having the adjusted phase.

The clock generator can provide other clock signals to other devices and adjust a phase of each of the other clock signals based on feedback signals received from the other devices.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 3 is a schematic block diagram of a clock generator according to an embodiment.

FIG. 4 is a schematic block diagram of a feedback processor according to an embodiment.

FIG. 5 is a schematic block diagram of a clock generating circuit according to an embodiment.

FIG. 24 is a schematic diagram of an electronic system with a clock generator and data converter having bi-directional interfaces according to an embodiment.

FIG. 25 is a schematic diagram illustrating signal propagation in the system of FIG. 24.

DETAILED DESCRIPTION

Figure 1:
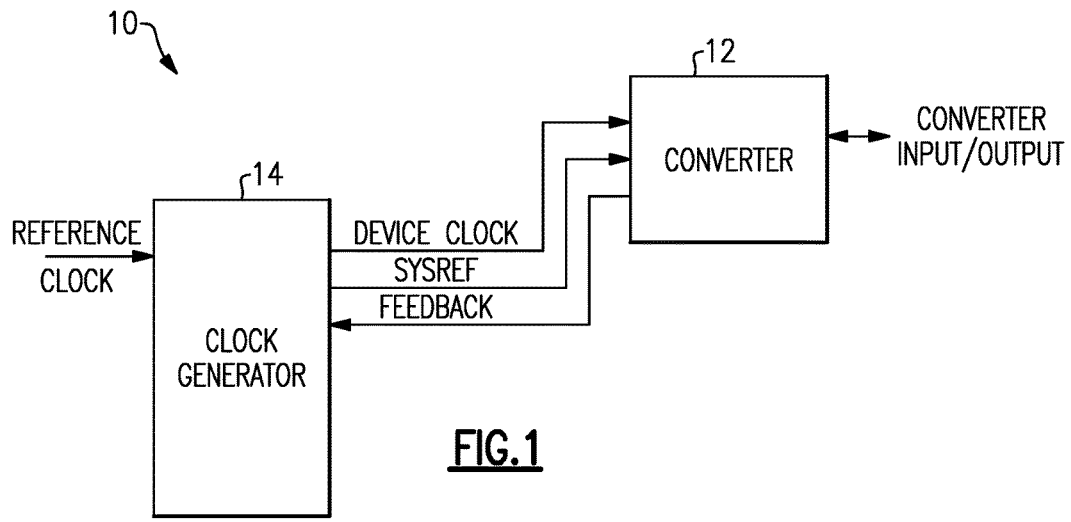
FIG. 1 is a schematic diagram of an electronic system in which a data converter provides a feedback signal to a clock generator according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and do not necessarily affect the scope or meaning of the claims.

An electronic system can include a clock generator that provides device clock signals to data converters so as to keep the data converters synchronized. Such an electronic system can be included in a wireless communication system arranged to perform periodic calibrations as a part of channel calculations. Calibration can utilize valuable data transmission time. Periodic calibrations can limit a phase synchronization specification to the time between the calibrations. Operators of such systems may desire to extend the time between calibrations. However, a change in the phase of one or more device clock signals due to the hardware is one of the factors that can limit the ability to extend the time between calibrations.

Time dependent phase errors can be caused by differences in a transfer function from an input clock to a data converter output and from differences in the paths of the device clock signals from a common clock generator. These differences can be due to dissimilarities in the signal paths stemming from semiconductor process variations (e.g., manufacturing variations) on devices, temperature gradients in the system, trace routing differences between clock paths, the like, or any combination thereof.

Aspects of this disclosure relate to controlling a phase of one or more device clock signals provided to devices, such as data converters. This can synchronize the devices both at initial system start up and during typical operation. Accordingly, aspects of this disclosure related to adjusting the phase of a clock signal provided to a device relative to the phase of another clock signal provided to a different device. This is different from certain traditional feedback loop systems that are arranged to reduce feedback signal phase difference to a minimum amount relative to another signal of a clock generator (e.g., as would be done by a phase-locked loop). The phase adjustment disclosed herein can synchronize devices at any desired nodes within the devices. For instance, devices can be synchronized at their outputs. As another example, devices can be synchronized at their sampling nodes, such as data converter sampling nodes. Enhanced control of the phases is also disclosed.

Enhanced synchronization, phase control, and phase tracking can be achieved in accordance with aspects of this disclosure. A feedback signal from one or more devices (e.g., a data converter (such as an analog-to-digital converter, a digital-to-analog converter, or a time-to-digital converter), a transceiver, a multi-channel converter, a local oscillator generator, a phase-locked loop, a mixed-signal front end, etc.) can be provided to a clock generator. The feedback signal can be provided to a dedicated contact of a clock generator or to a bi-directional interface of a clock generator that is also configured to output a system reference signal (e.g., a SYSREF signal in accordance with a JESD204B or JESD204C standard). The clock generator can provide a device clock signal for the device that provides a feedback signal. The term "device clock signal" can refer to clock signal from a clock generator that is used as a clock signal on a device. As used herein, the term "device clock signal" encompasses "DEVCLK" and "Device Clock" as defined in the JESD204B and JESD204C standards.

Aspects of this disclosure relate to a feedback signal processor configured to generate a phase control signal based on a feedback signal from a device arranged to receive a clock signal from a clock generator. The feedback processor can include a phase processor, a calculation circuit, and a phase control port. The phase processor can receive the feedback signal from the device. The phase processor can provide a signal that comprises phase information associated with the device that receives the dock signal from the dock generator. The calculation circuit can compute a phase control signal based on the signal from the phase processor that comprises phase information associated with the device. Alternatively or additionally, the calculation circuit can compute the phase control signal based on other information, such as process information, voltage information, temperature information, or any combination thereof. The phase control signal can be any suitable signal that adjusts the phase of the clock signal. The feedback signal processor can provide the phase control signal to the phase control port. The phase control port can be coupled to a clock generating circuit of the clock generator. The phase control signal can cause the clock generating circuit to adjust the phase of the device clock signal. This can cause an output of the device to have a desired phase. With the desired phase, the output of the device can be synchronized with an output of one or more other devices.

The feedback signal can be associated with a device having an output signal with a phase that is controllable by a phase of the device clock signal provided to the device. The feedback processor can receive the feedback signal from a device having a phase to be tracked. The device can be a data converter, such as an analog-to-digital converter or a digital-to-analog converter, a phase-locked loop, a communications transceiver, or any other suitable clocked device.

The calculation circuit can compute the phase control signal based on an output from the phase processor and/or additional information. The phase control signal can be used to align phases associated with different devices for synchronizing the devices. The additional information can include, for example, temperature information associated with a die of the device that is providing the feedback signal, temperature information associated with the clock generator device, data that controls a desired mathematical processing that is to be used with the input data, information from another feedback signal processor (e.g., to provide information about a phase of a different feedback signal from a different data converter relative to the data converter), the like, or any combination thereof. Any other suitable additional information can alternatively or additionally be used by the calculation circuit to compute the phase control signal.

The calculation circuit can compute a desired response based on input data. The desired response and/or an actual response can be used to adjust the phase control signal. The calculation circuit can compute a desired response based on feedback phase information, temperature information of a die from which the feedback signal is received, feedback phase and temperature information, data associated with phase and/or die temperature information associated with one or more devices that are separate from the device providing the feedback signal, the like, or any combination thereof. The calculation circuit can perform an adaptive calculation of a desired response (e.g., automatic calculation of the mathematical response).

As one example, two different data converters can have different phase delays associated with temperature and the calculation circuit use compensate for the delay associated with each data converter to synchronize the data converters. In this example, the calculation circuit can compensate for the delays associated with each data converter by implementing different adjustments to phase control signals associated with each data converter. Such responses can implement compensation by having clock signals and/or feedback signal with different phases on the clock generator chip.

The feedback signal processor can include one or more outputs arranged to adjust a phase of an output signal (e.g., a device clock signal) provided by a clock generator. For instance, an output of the feedback processor can be provided to a digital phase-locked loop (DPLL) phase offset control. As another example, an output of the feedback processor can be arranged to adjust delays before the phase-frequency detector (PFD) in a phase-locked loop. As another example, an output of the feedback processor can be provided to a circuit located in the forward path of a device clock signal on the clock generator, such as a digital divider's coarse phase step or to a delay line control port. In yet another example, an output of the feedback signal processor can be provided over a data link to a device, such as a data converter. In some instances, the output of the feedback signal processor can be provided over a serial peripheral interface (SPI) or embedded on a device clock signal, such as the DEVCLK signal defined by a JESD204 standard.

While embodiments of this disclosure may be discussed with reference to adjusting a phase associated with a device clock signal provided to a device, any suitable principles and advantages discussed herein can be implemented in connection with adjusting a phase of any suitable dock signal. For instance, any suitable principles and advantages discussed herein can be implemented in connection with adjusting a phase of a system reference signal, such as a SYSREF signal in accordance a JESD204 standard, provided to a device. In this example, the phase of one or more system reference signals can be adjusted to align with the phase of one or more other system reference signals to cause devices to be synchronized. As another example, some devices can locally generate a system reference signal and the system reference signal can be locally adjusted. For instance, a data converter can locally generate a system reference signal, such as a SYSREF signal in accordance a JESD204 standard, and a phase control signal can adjust a phase of one or more locally generated system reference signals. Accordingly, distributed SYSREF generators can he aligned (e.g., by a clock generator) using one or more feedback signals.

Systems with Clock Generator Arranged to Receive Feedback from a Device

Illustrative electronic systems in which a clock generator receives feedback from a device arranged to receive a clock signal (e.g., a device clock signal such as "Device Clock" or "DEVCLK" defined by a JESD204 standard) from the clock generator will now be described. Such systems can have enhanced synchronization of output signals of devices configured to receive clock signals from the clock generator. While sonic embodiments may be described with reference to devices being data converters, the principles and advantages discussed herein can be applied to any suitable devices arranged to receive a clock signal from a clock generator and/or any other signal that could benefit from synchronization with one or more other signals.

FIG. 1 is a schematic diagram of an electronic system 10 in which a data converter 12 provides a feedback signal to a clock generator 14 according to an embodiment. The data converter 12 and the clock generator 14 can be separate devices. For instance, these devices can be enclosed within separate packages and/or on different semiconductor die. The data converter 12 and the clock generator 14 can be separate packaged chips. The data converter 12 and the clock generator 14 can be separate integrated circuit devices. The techniques discussed herein can be implemented on-chip or within the same package in some instances. There can be relatively short, point-to-point links between the data converter 12 and the clock generator 14. Such links can be on the same printed circuit board or across relatively short cables, for example.

In the electronic system 10, the data converter 12 can be a digital-to-analog converter, an analog-to-digital converter, or any other suitable data converter. The data converter 12 can receive a device clock signal Device Clock and a system reference signal SYSREF from the clock generator 14. These signals can each be in accordance with a JESD204 standard, such as JESD204B or JESD204C. The device clock signal Device Clock can be used as a clock signal for functions on the data converter 12. The system reference signal SYSREF can be a system reference signal that is source synchronous to the device clock signal Device Clock. The system reference signal SYSREF can be distributed for enhancing setup and/or hold time compliance at receiving circuitry of the data converter 12.

The clock generator 14 can receive a reference signal Reference Clock and generate a device clock signal Device Clock for the data converter 14. As shown in FIG. 1, the data converter 12 can provide a feedback signal Feedback to the clock generator 14. The clock generator 14 can adjust a phase of the device clock signal Device Clock based on the feedback signal Feedback. Accordingly, the electronic system 10 provides closed loop feedback to adjust the device clock signal Device Clock.

In certain embodiments, the feedback signal Feedback can be provided to a dedicated port of the clock generator 14 as shown in FIG. 1. According to some other embodiments discussed herein, the feedback signal can be provided to a bi-directional interface of a clock generator. The feedback signal Feedback can provide a variety of information in certain embodiments. For instance, the feedback signal Feedback can provide phase information associated with the data converter 12, data from the data converter 12, or phase information and data from the data converter 12. The data converter 12 can transmit the feedback signal Feedback continuously and/or intermittently to the clock generator 14.

Figure 2:
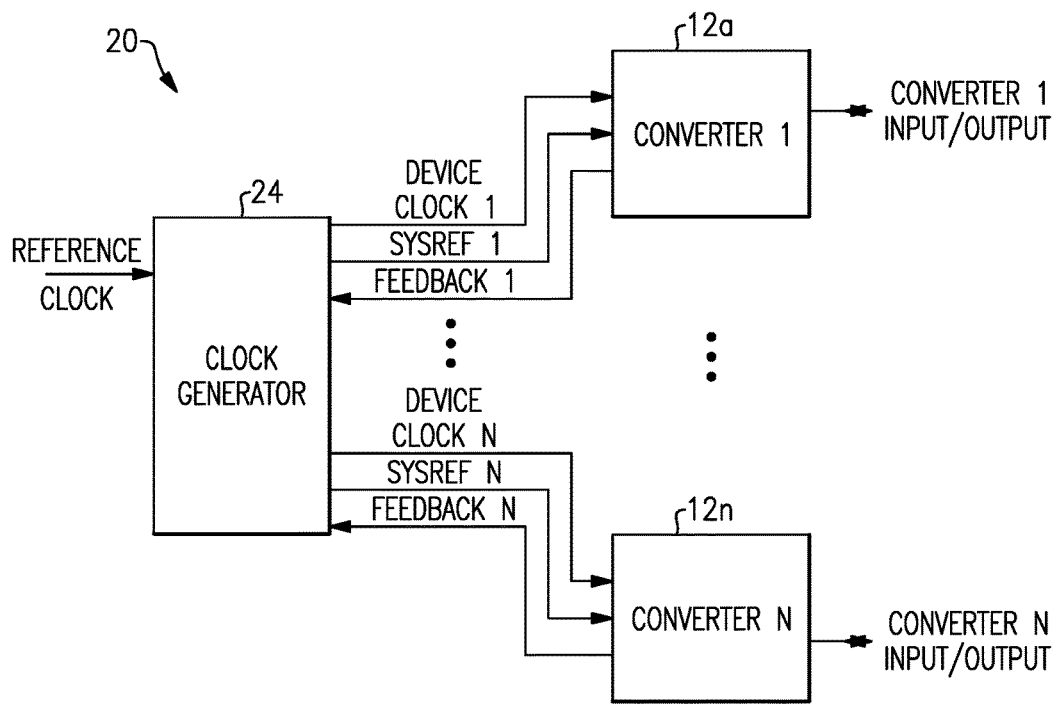
FIG. 2 is a schematic diagram of an electronic system in which a plurality of data converters provides feedback signals to a clock generator according to an embodiment.

A phase associated with the data converter 12 can be based on the device clock signal Device Clock. The phase associated with the data converter 12 can be, for example, a phase of the device clock signal Device Clock at an input of the data converter 12, a phase of a dock signal at a sampling node of the data converter 12, or a phase of a signal at an output of the data converter 12 that is coupled to circuitry other than the clock generator 14. The device clock signal Device Clock can be used for docking on the data converter 12 such that the phase associated with the data converter 12 is dependent on the device clock signal Device Clock. Adjusting a phase of the device clock signal Device Clock can adjust the phase associated with the data converter 12. Accordingly, adjusting the phase of the device clock signal Device Clock should adjust the phase associated with the data converter FIG. 2 is a schematic diagram of an electronic system 20 in which a plurality of data converters 12a to 12n provides feedback signals Feedback 1 to Feedback N to a clock generator 24 according to an embodiment. These feedback signals can provide phase synchronization information for the data converters 12a to 12n. The clock generator 24 can synchronize the phases of outputs of the data converters 12a to 12n using the feedback signals Feedback 1 to Feedback N. FIG. 2 illustrates that any of the principles and advantages discussed herein can be implemented in a system in which a clock generator 24 provides device clock signals Device Clock 1 to Device Clock N to a plurality of separate devices. The separate devices can be separately packaged integrated circuit devices. Phase adjustment of a device clock signal based on a feedback signal can be implemented to better synchronize nodes (e.g., sampling nodes, output nodes, etc.) of the different devices that receive device clock signals. The different devices can receive the different device clock signals from the same clock generator as shown in FIG. 2. In the electronic system 20, adjusting the phase of one or more of the device clock signals Device Clock 1 to Device Clock N based on one or more of the feedback signals Feedback 1 to Feedback N can improve synchronization of outputs Converter 1 Output to Converter N Output of the data converters 12a to 12n, respectively.

Clock Generators Configured to Receive Feedback from a Device

Illustrative clock generators and circuit components thereof will now be described. Such clock generators can be implemented in any of the electronic systems discussed herein. Any circuit blocks of the clock generators can be implemented in accordance with any suitable principles and advantages of other circuit blocks of the clock generators discussed herein.

FIG. 3 is a schematic block diagram of a clock generator 30 according to an embodiment. This clock generator is an example clock generator that can be implemented in the systems of FIGS. 1 and/or 2. The clock generator 30 includes a feedback signal processor 32 and clock generating circuit 34. The feedback signal processor 32 is arranged to receive a feedback signal at a contact 35 of the clock generator 30. The feedback signal can include differential signals in some applications. The feedback signal carries information that originates from another device. The information on the feedback signal can depend on the device clock signal Device Clock provided by the clock generator 30. The feedback processor 32 can generate a phase control signal in response to the feedback signal. The phase control signal can be any suitable signal to adjust a phase of a clock signal. The feedback processor 32 can track a phase of the feedback signal and adjust the phase control signal so as to result in a desired adjustment of a phase of the device clock signal Device Clock. The feedback processor 32 can provide the phase control signal to the clock generating circuit 34 to adjust the phase of a device clock signal Device Clock provided by the clock generator 30.

When the feedback signal comprises phase information, the feedback signal processor 32 can monitor the phase of the device clock signal provided by the clock generator 30. The feedback signal processor 32 can provide a phase control signal to the clock generating circuit 34 such that the feedback signal can cause the device clock signal to be phase shifted in a desired manner. One or more phase control signals from the feedback signal processor 32 can adjust the device clock signal in a manner that compensates for initial start-up phase of the feedback signal, for changes in the feedback signal over temperature, for changes in the device clock signal provided by the clock generator 30, or combinations thereof. As discussed in more detail in connection with other embodiments, one or more phase control signal can compensate for a variety of other factors such as relative phase differences between different devices. The compensation can hold a phase associated with a device clock signal substantially constant over time. For instance, the compensation can hold a phase of a data converter or other device substantially constant over time.

As illustrated, the clock generating circuit 34 includes a phase control port configured to receive the phase control signal from the feedback processor 32. The clock generating circuit 34 can include any suitable circuitry arranged to receive a reference signal at an input port 36 and provide a device clock signal at an output port 37 of the clock generator 30. The clock generating circuit 34 can include a clock signal source and a clock signal path. The clock signal source can include a phase-locked loop and/or other circuitry arranged to generate a clock signal from a reference signal. The clock signal path can include one or more buffers, one or more delay elements, routing, and/or one or more other elements in a signal path between the clock signal source and the output port 37 of the clock generator 30 arranged to provide the device clock signal.

FIG. 4 is a schematic block diagram of a feedback signal processor 40 according to an embodiment. The feedback signal processor 40 is an example of the feedback signal processor 32 of FIG. 3 and can be implemented in accordance with any suitable principles and advantages discussed herein. The feedback signal processor 40 includes a phase processor 42 and a calculation circuit 44. A clock generator can include the entire feedback signal processor 40. In some instances, the phase processor 42 can be separately located (e.g., on a different die or within a different package) from the calculation circuit 44. For example, the calculation circuit 44 can be located on a different device (e.g., an FPGA or CPU) than the clock generator. This can allow calculations to be performed using information from multiple feedback signals to multiple phase processors. In an embodiment, the feedback signal processor 40 can be implemented on a device configured to receive a device clock signal from the clock generator and provide phase adjustment on the device. The feedback signal processor 40 can receive the feedback signal Feedback at input port 46. The feedback signal Feedback can include phase and/or data information associated with a device arranged to receive a device clock signal provided by a clock generator. The feedback signal processor 40 can calculate a response that can result in a desired adjustment to the phase of the device clock signal based on the feedback signal Feedback. One or more phase adjustment control ports 48 can be provided as outputs of the feedback signal processor 40. This can allow one or more phase adjustment signals to be provided to clock generating circuitry to adjust the phase of device clock signal with a desired magnitude and/or rate of change.

The phase processor 42 can receive the feedback signal at an input 46 of the feedback signal processor 40. The phase processor 42 can process the feedback signal Feedback and provide a phase signal Phase Information indicative of a phase associated with the device configured to provide the feedback signal Feedback. The phase signal Phase Information can be a digital signal so that the calculation circuit 44 can be implemented by digital circuitry and compute the phase control signal Phase Control in the digital domain. Such digital circuitry can be more reliable and/or less prone to environmental effects (e.g., temperature) than analog circuitry and/or relatively inexpensive to implement. The calculation circuit 44 can be re-configurable (e.g., through programming the clock generator through an interface, such as a serial port interface). In certain embodiments, the phase processor 42 includes a time-to-digital converter arranged to convert the feedback signal Feedback to a digital phase signal Phase Information. The phase signal Phase Information can be indicative of a phase of an output of the device arranged to provide the feedback signal Feedback, a phase of a signal on the device arranged to provide the feedback signal Feedback, a delay associated with the device clock signal propagating to a node on the device arranged to provide the feedback signal Feedback, or any combination thereof.

The calculation circuit 44 can determine a response of the phase control signal Phase Control in response to input data, such as the phase signal Phase Information. As will be discussed in more detail below, the calculation circuit can also determine a response of the phase control signal Phase Control in response other input information. The calculation circuit 44 can provide a linear response relative to its input data in certain embodiments. According to some other embodiments, any suitable mathematical response can be implemented in order to achieve a desired result, such as enhancing synchronization of data converters in communication with one or more clock generators. The mathematical response used can also change depending upon the information supplied to the calculation block. Operation in this flexible manner can allow the feedback signal processor 40 to support multiple mathematical responses relative to the various input data including, but not limited to, predictive response relative to the behavior of one or more pieces of input data.

In certain embodiments, the calculation circuit 44 can compute the phase control signal Phase Control based on the phase signal Phase Information from the phase processor 42 and/or additional information. The additional information can be used to determine a desired phase adjustment behavior of the device clock signal, such as a DEVCLK signal defined by a JESD204 standard. This behavior can have any suitable relationship between different sets of input data and phase adjustment ports. For instance, the phase adjustment can be linear, non-linear, statically mapped, dynamically mapped and/or calculated, the like, or any suitable combination thereof. Device clock signal phase adjustment can synchronize multiple devices (e.g., data converters) and/or multiple clock signals provided the multiple devices. The calculation circuit 44 can be arranged to implement any suitable mathematical relationship to accomplish such synchronization by utilizing any of the available information (e.g., feedback phase, device temperature(s), phase relative to other converter(s), etc., or any combination thereof). More details regarding using additional information to compute a phase control signal will be provided in connection with some other embodiments.

FIG. 5 is a schematic block diagram of a clock generating circuit 50 according to an embodiment. The clock generating circuit 50 of FIG. 5 is an example of the clock generating circuit 34 of FIG. 3. The clock generating circuit 50 can generate a device clock signal Device Clock for a device, such as a data converter, from a reference signal Reference Clock. The clock generating circuit 50 can include one or more input ports arranged to receive a phase control signal Phase Control from a feedback signal processor to adjust the phase of the device clock signal Device Clock. As illustrated, the clock generating circuit includes a clock signal source 52 and a clock signal path 54. The clock signal source 52 can include any suitable circuit arranged to generate a clock signal from a reference signal, such as a system clock signal. For instance, the clock signal source 52 can include a phase-locked loop. Such a phase-locked loop can be any suitable analog phase-locked loop or any suitable digital phase-locked loop. The clock signal path 54 can include any suitable circuitry in a signal path between the clock signal source 52 and an output port of the clock generating circuit 50 arranged to provide the device clock signal Device Clock. The clock signal path 54 can include a divider or delay element, such as an adjustable delay element, for example.

Adjusting Phase of a Clock Based on Feedback Signal in Electronic Systems

Phase adjustment of a clock signal, such as a device clock signal, can be implemented in a variety of electronic systems. Features of such systems will be described with reference to illustrative embodiments. Any suitable combination of features of an embodiment can be combined with any suitable combination of features of another embodiment. Such systems can include a clock generator and data converters in accordance with any suitable principles and advantages discussed herein. While some embodiments are described with reference to an electronic system with a clock generator and a data converter, any of the principles and advantages of these embodiments can be applied to electronic systems that include two or more data converters and/or other devices arranged to receive device clock signals.

Figure 6:
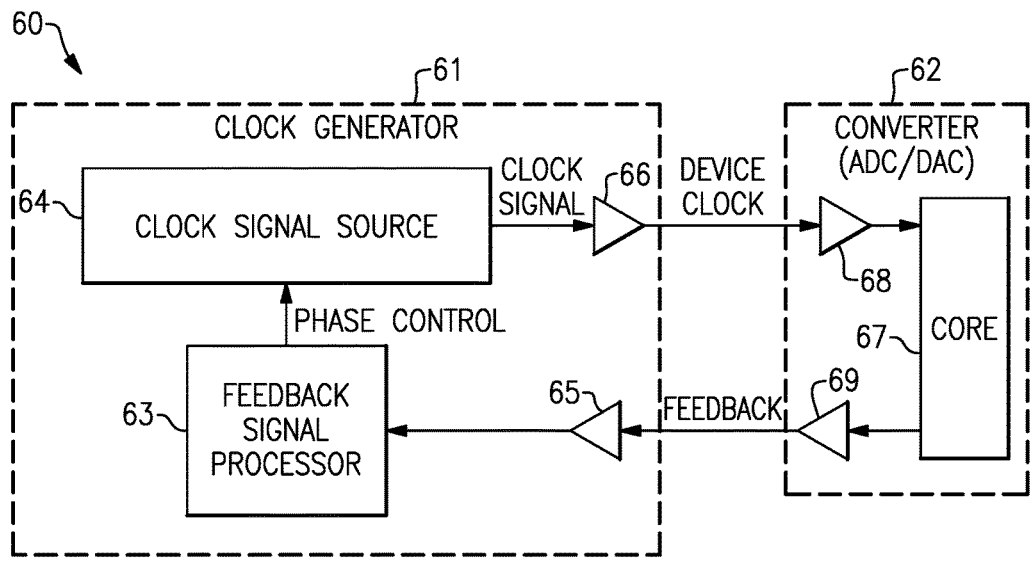
FIG. 6 is a schematic diagram of an electronic system with phase adjustment of a device clock signal based on feedback from a device according to an embodiment.

FIG. 6 is a schematic diagram of an electronic system 60 with phase adjustment of a device clock signal based on feedback from a device according to an embodiment. As illustrated, the electronic system 60 includes a clock generator 61 and a data converter 62. In FIG. 6, the clock generator 61 includes a feedback signal processor 63 and a clock signal source 64. The feedback signal processor 63 is arranged to receive the feedback signal Feedback from the data converter 62 by way of an input receiver 65. FIG. 6 illustrates that phase adjustment of a device clock signal can be implemented by providing a phase control signal Phase Control generated by the feedback signal processor 63 to a phase adjustment port of the clock signal source 64. The output of the clock signal source 64 can be output from the clock generator by way of an output driver 66. Accordingly, the clock generator 61 can provide a device clock signal Device Clock to the data converter 62 with a desired phase. With this desired phase, the data converter 62 can be synchronized with one or more other data converters. For instance, with the desired phase, a sampling node of the data converter 62 can be synchronized with sampling node(s) of one or more other data converters.

The data converter 62 can include a core circuit 67 configured to implement any suitable data conversion, such as converting an analog signal to a digital signal or converting a digital signal to an analog signal. The core circuit 67 can provide an output of the data converter that has a data that depends on the device clock signal Device Clock, for example, a DAC signal output or an ADC's sampled signal data. An input driver 68 of the data converter can receive the device clock signal Device Clock and provide the core circuit 67 with an internal device clock signal. The core circuit 67 can also generate feedback for the clock generator 61. The feedback signal (analog or digital in form) can be related to a location or circuit on the core circuit 67 that is to be synchronized with another converter. For instance, the feedback signal can be related to a sampling node of a data converter by having a clock signal path that matches or includes portions of a clock signal path to the sampling node. As another example, the feedback signal can include data that represents the data converter's own measurement of a difference between a phase at the sampling node and a device clock signal location at the data converter's clock receiver. As another example, the feedback signal can include a representation of the phase of a local SYSREF generator of a data converter. An output driver 69 can provide the feedback signal Feedback from the data converter 62 to the clock generator 61.

In some instances, the device clock signal Device Clock and the feedback signal Feedback of any of the embodiments discussed herein can have frequencies that are harmonically related to each other.

The feedback signal processors discussed herein can include multiple inputs and/or multiple outputs. Such feedback signal processors can include a variety of calculation circuits with different configurations. Some calculation circuits can be configurable to perform a variety of different computations in computing one or more phase control signals.

For instance, certain feedback signal processors can include a filter, such as a low-pass filter (e.g., a digital low-pass filter or an analog low-pass filter), coupled in a signal path between a calculation circuit and a phase adjustment port of a clock generating circuit. In some such feedback signal processors, feedback phase information can be used to control one or more phase adjustment ports with a low-pass filtered response. A second low-pass filter can also be implemented to control a different phase adjustment port of the clock generating circuit with a low-pass filtered response. Data from another input to the calculation circuit can be used to control a third phase adjustment port without a filtered response.

According to certain embodiments, responsive to a difference between the feedback phase and a reference clock phase provided as an input to the calculation circuit satisfying a threshold (e.g., being greater than the threshold), a low-pass filter in a signal path to one or more phase adjustment ports can have its bandwidth increased in order to speed up the response. Alternatively or additionally, the bandwidth of the low-pass filter can be decreased in other circumstances.

In some embodiments, a phase control signal provided to a third phase adjustment port can have a values determined in a predictive manner in response to the other input data. For example, when the other input data is temperature information, the calculation circuit can implement predictive adjustments based on the rate of change of temperature rather than an absolute value of temperature.

Figure 7:
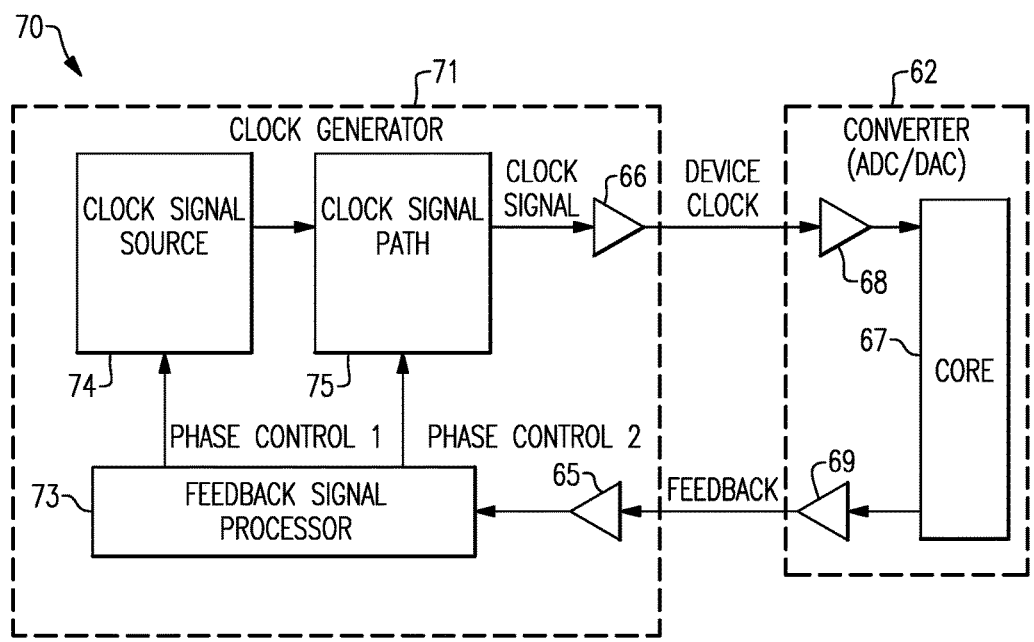
FIG. 7 is a schematic diagram of an electronic system with phase adjustment of a device clock signal in a clock signal source and in a clock signal path according to an embodiment.

The feedback signal processor can receive additional input information, such as temperature information from the system, in certain embodiments. The feedback signal processor can provide one or more phase control outputs that are calculated in a linear or non-linear manner based on the feedback signal and/or the additional input information. The one or more phase control output can control the phase of the device clock signal provided by a clock generator, FIG. 7 is a schematic diagram of an electronic system 70 with phase adjustment of a device clock signal in a clock signal source and in a clock signal path according to an embodiment. As shown in FIG. 7, more than one phase adjustment port and/or phase adjustment method can be implemented. A phase control signal can be provided to a phase adjustment port of a clock signal source (e.g., a phase-locked loop) and/or to a phase adjustment port of a clock signal path. In the electronic system 70, multiple outputs from a feedback signal processor 73 can be used to adjust the phase of the device clock signal Device Clock. The feedback signal processor 73 can provide a first phase control signal Phase Control 1 to a phase adjustment port of a clock signal source 74. The feedback signal processor 73 can also provide a second phase control signal Phase Control 2 to a phase adjustment port of a dock signal path 75. Accordingly, the phase of the device clock signal Device Clock can he adjusted using the clock signal source 74 and/or the clock signal path 75.

Figure 8:
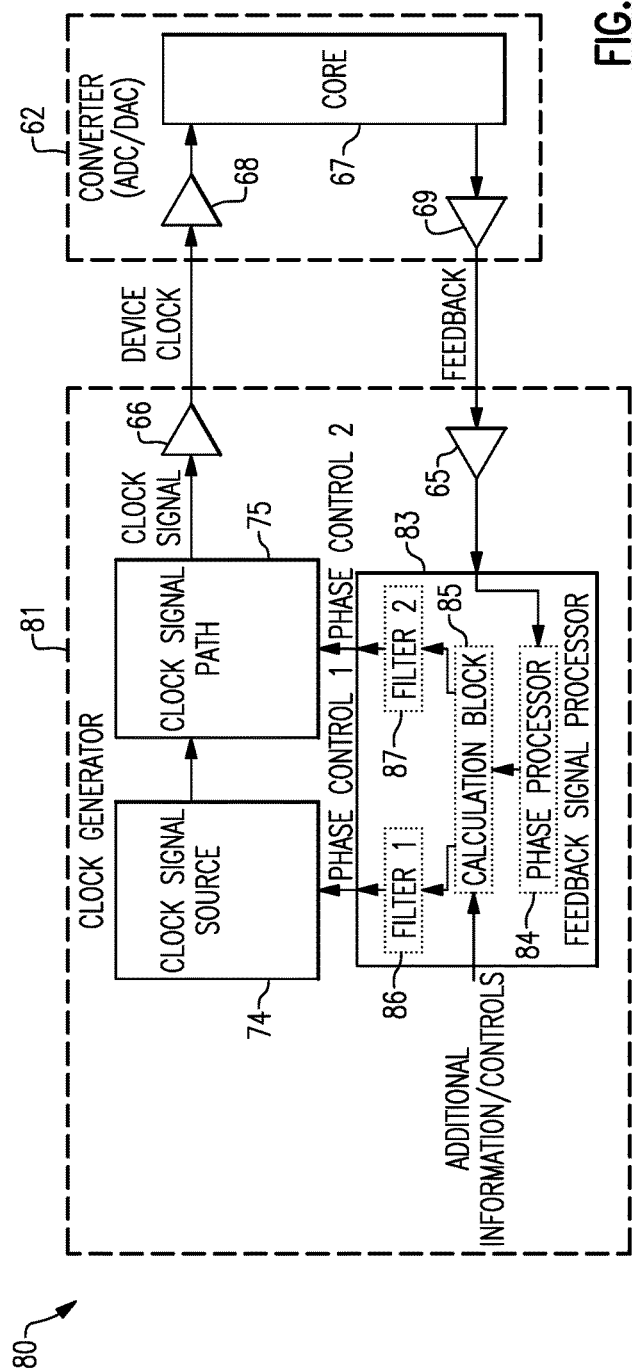
FIG. 8 is a schematic diagram of an electronic system with phase adjustment of a device clock signal based on feedback from a device and additional information according to an embodiment.

FIG. 8 is a schematic diagram of an electronic system 80 with phase adjustment of a device clock signal based on feedback from a device and additional information according to an embodiment. In the electronic system 80, a clock generator 81 includes a feedback signal processor 83 configured to receive additional information and provide multiple outputs. The illustrated feedback signal processor 83 includes a phase processor 84, a calculation circuit 85 configured to receive additional information, a first filter 86, and a second filter 87. The calculation circuit 85 can compute phase control signals Phase Control 1 and Phase Control 2 based on phase information from the phase processor 84 and/or the additional information. The additional information can include any of the additional information discussed herein, such as temperature information. The calculation circuit 85 can be implemented in digital circuitry. The first filter 86 and the second filter 87 can be implemented by any suitable circuitry, such as digital circuitry and/or analog circuitry. Outputs of the calculation circuit 85 can be filtered by filters 86 and 87, respectively, and provided to the clock signal source 74 and the clock signal path 75, respectively. As such, the feedback processor 83 can receive multiple inputs and provide multiple phase control outputs to cause the phase of the device clock signal Device Clock to be adjusted in multiple ways.

A feedback signal processor can use additional information in addition to or instead of information provided by a feedback signal provided by a device configured to receive a device clock signal. For example, when a value associated with the phase of the feedback signal is in an acceptable range, the feedback signal processor can use temperature data to control adjustments to the phase of the device clock signal while only observing the phase information. The selection of which information is used in the calculation circuit can change while the system is in operation. For example, the selection of which information to use by the calculation circuit in computing a phase control signal can occur in response to a control signal provided to the feedback processor.

Phase adjustment signals can compensate for an error mechanism on a device, such as a data converter, having an output that is being synchronized with another device, such as another data converter. Such compensation can be implemented by a calculation circuit of a feedback signal processor.

Phase information sent over a feedback link from a data converter to the feedback signal processor can be analog in nature, such as signal edge location. Phase information sent over a feedback link from a data converter to the feedback signal processor can alternatively include digital data transmitted over the feedback signal. The data information sent over the feedback link can include information such as, but not limited to, device die temperature and/or states of device dividers.

Figure 9:
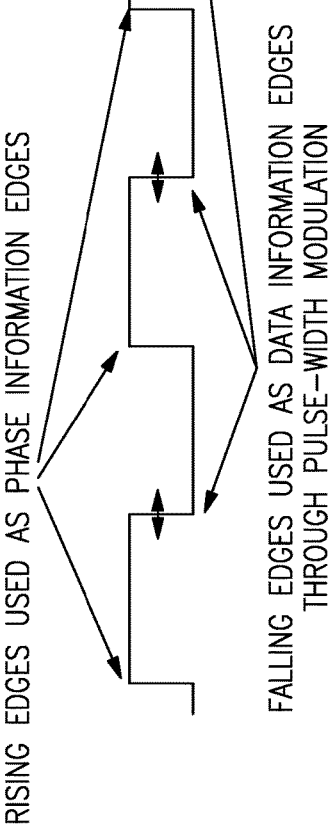
FIG. 9 is a timing diagram of feedback signal that includes phase and data information.
Figure 10:
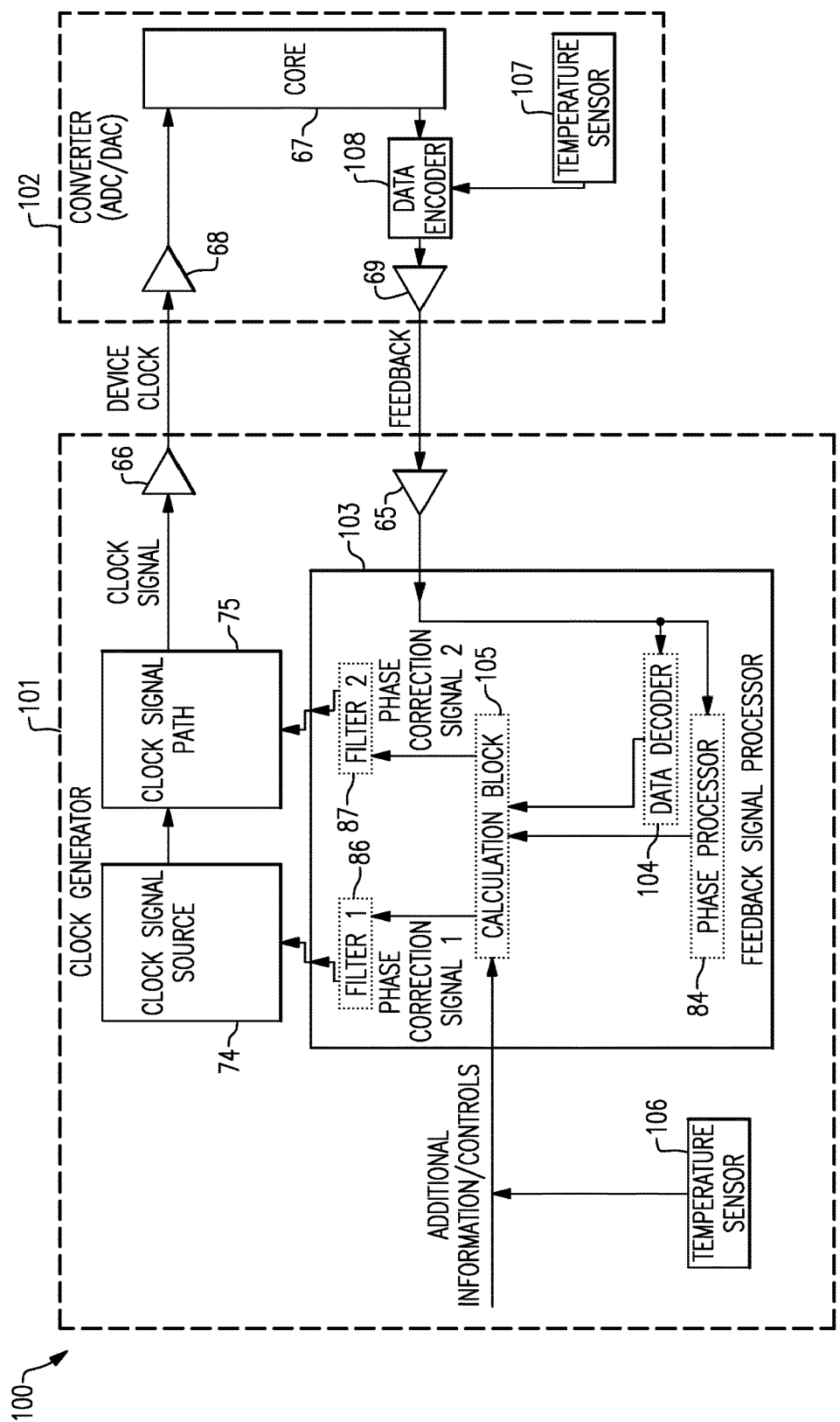
FIG. 10 is a schematic diagram of an electronic system with phase adjustment of a device clock signal based on a feedback signal with encoded temperature information according to an embodiment.

When the feedback signal is configured to include data information, such as device die temperature, the processor can use that information in the calculations to adjust the phase of the device clock signal. Phase and data information can be combined on the feedback signal in a variety of different ways, in the digital and/or analog domain. Examples of methods include pulse-width modulation of edges and spread spectrum modulation. FIG. 9 provides one example of combining phase and data information. When both phase and data information are present, a feedback signal processor can include a data decoder to separate the phase and/or data information of the feedback signal. FIG. 10 includes an example data decoder to separate the phase and data information of a feedback signal.

FIG. 9 is a timing diagram of feedback signal that includes phase and data information. In this example, the phase information is contained in the timing of the rising edge of the feedback signal and the data is provided through pulse width-modulation of the falling edge. A feedback signal processor can receive such a feedback signal and separate out the phase information and/or the data information. The feedback signal processor can use the phase information and/or the data information in adjusting the phase of the device clock signal.

FIG. 10 is a schematic diagram of an electronic system 100 with phase adjustment of a device clock signal based on a feedback signal with encoded temperature information according to an embodiment. The electronic system 100 includes a clock generator 101 and a data converter 102. In the electronic system 100, temperature information is embedded on the feedback signal and decoded by a feedback signal processor 103. This temperature information is associated with the data converter 102. For instance, the temperature information embedded on the feedback signal can be indicative of a die temperature of the data converter 102.

As illustrated, the clock generator 101 includes a feedback signal processor 103 with a data decoder 104 configured to decode the temperature information from the feedback signal Feedback. The data decoder 104 can provide the decoded temperature information to the calculation circuit 105. The calculation circuit 105 can use the decoded temperature information to adjust the phase of the device clock signal Device Clock. The clock generator 101 can also include a temperature sensor 106. The temperature sensor 106 can provide temperature information associated with the clock generator 101 to the calculation circuit 105 for use in computing a phase control signal.

The data converter 102 can include a temperature sensor 107 and an encoder 108. The illustrated temperature sensor 107 is configured to provide temperature information associated with the data converter 102 to the encoder 108. Then the encoder 108 can encode the temperature information onto the feedback from the core circuit 67.

While FIG. 10 is described with reference to temperature information, any of the principles and advantages discussed with reference to FIG. 10 can be applied to any other suitable information.

Figure 11:
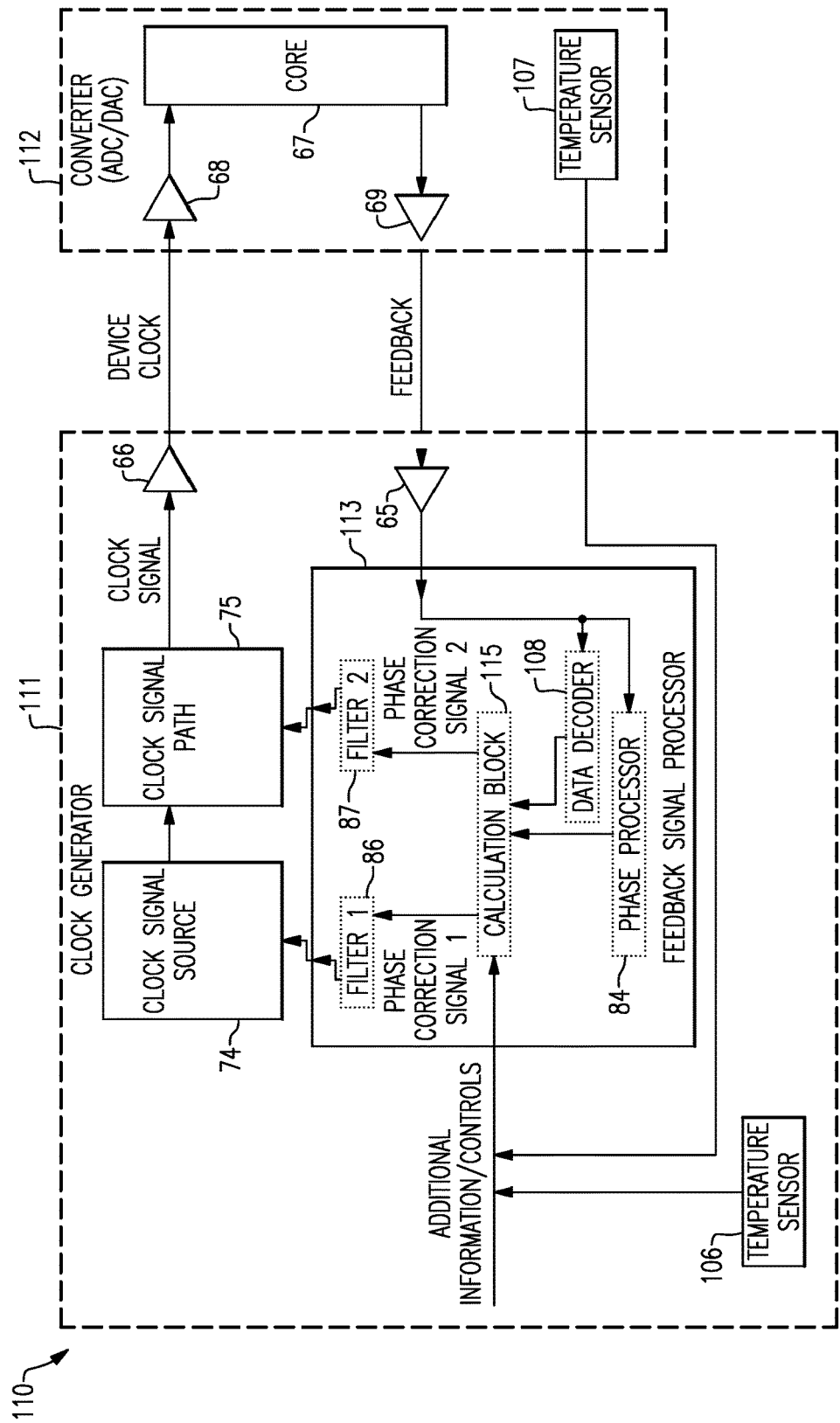
FIG. 11 is a schematic diagram of an electronic system with phase adjustment of a device clock signal based on a feedback signal from a device and temperature information according to an embodiment.

FIG. 11 is a schematic diagram of an electronic system 110 with phase adjustment of a device clock signal based on a feedback signal from a device and temperature information according to an embodiment, FIG. 11 shows that information can be send over a dedicated connection from a data converter to a calculation circuit of a feedback signal processor. The dedicated connection can be any suitable chip to chip interface, such as a serial peripheral interface (SPI). Temperature information, such as silicon temperature information, can be sent from a data converter 112 to a calculation circuit 115 of a feedback signal processor 113. A temperature sensor 106 of a clock generator 111 can provide temperature information, such as silicon temperature information, associated with the clock generator 111.

In some other embodiments, an intermediary device (e.g., a field-programmable gate array (FPGA), a microprocessor, or a buffer) can be configured to pass information between a data converter and a clock generator. In such embodiments, the feedback signal can include phase information, temperature information, both phase and temperature information, one or more control signals, or any other suitable information from a data converter for synchronizing data converters.

Figure 12:
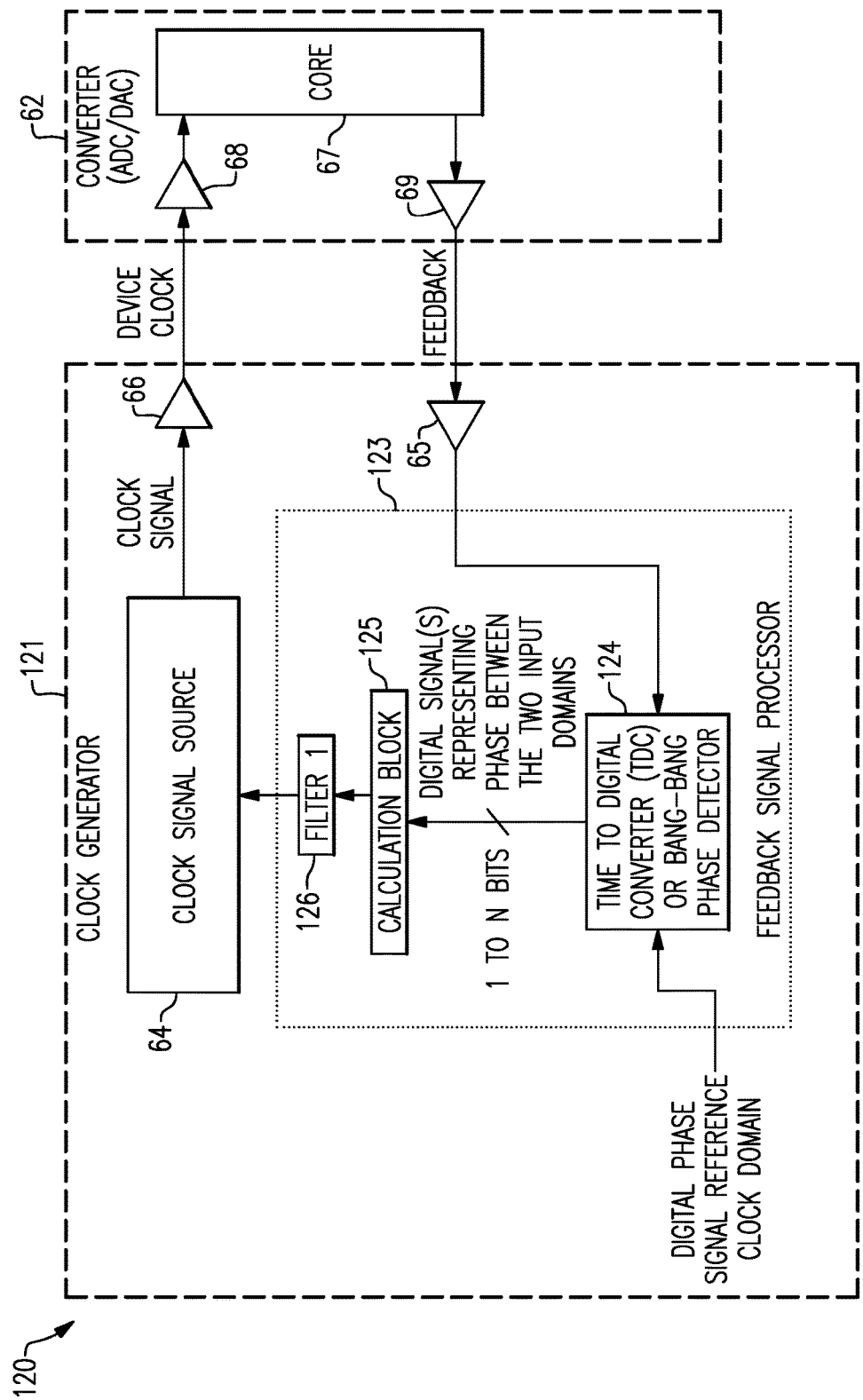
FIG. 12 is a schematic diagram of an electronic system with phase adjustment of a device clock signal based on a feedback with additional detail of a phase processor according to an embodiment.
Figure 13:
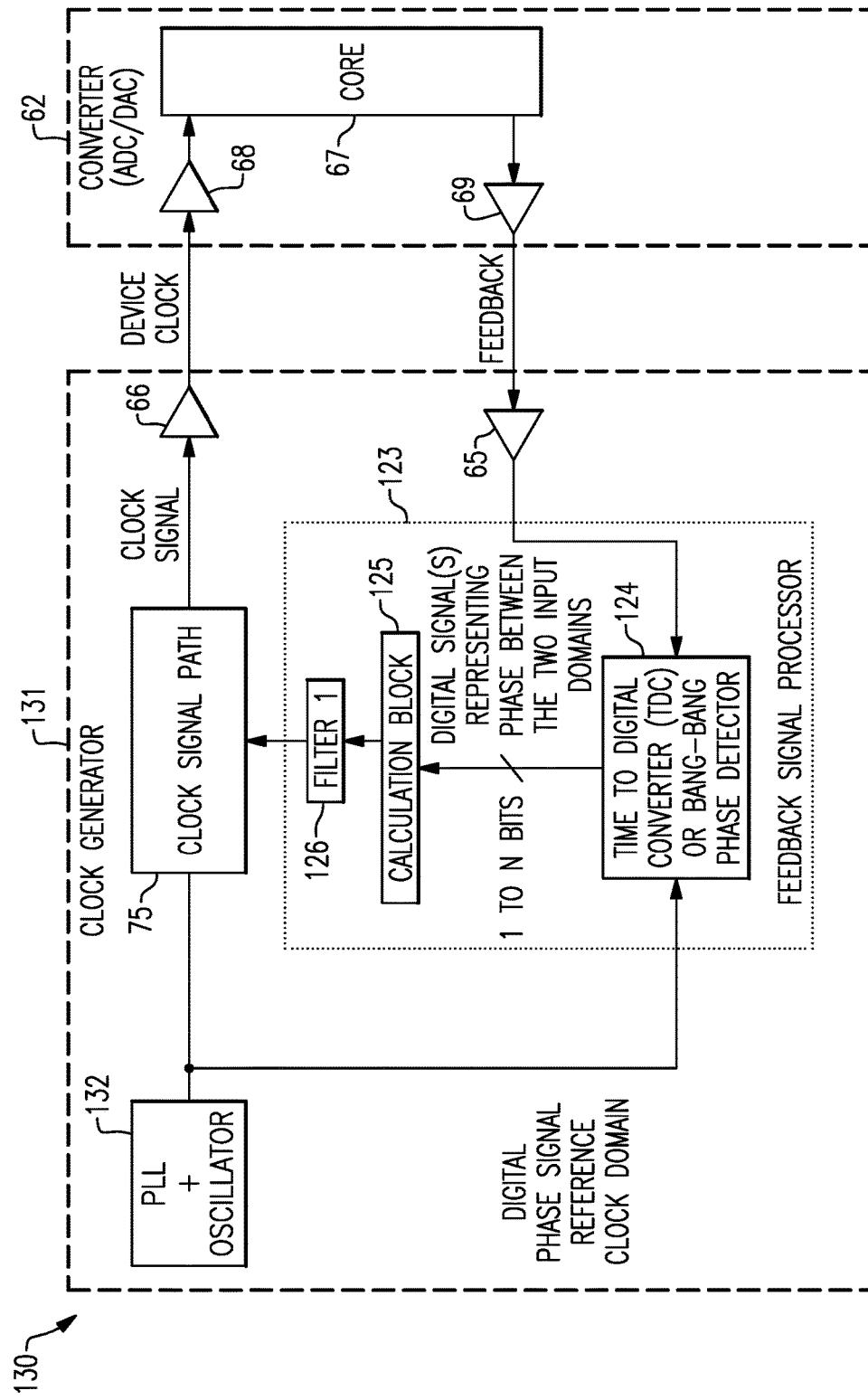
FIG. 13 is a schematic diagram of an electronic system with phase adjustment of a device clock signal in which a common oscillator provides a reference signal to a clock signal path and a feedback signal processor according to an embodiment.
Figure 14:
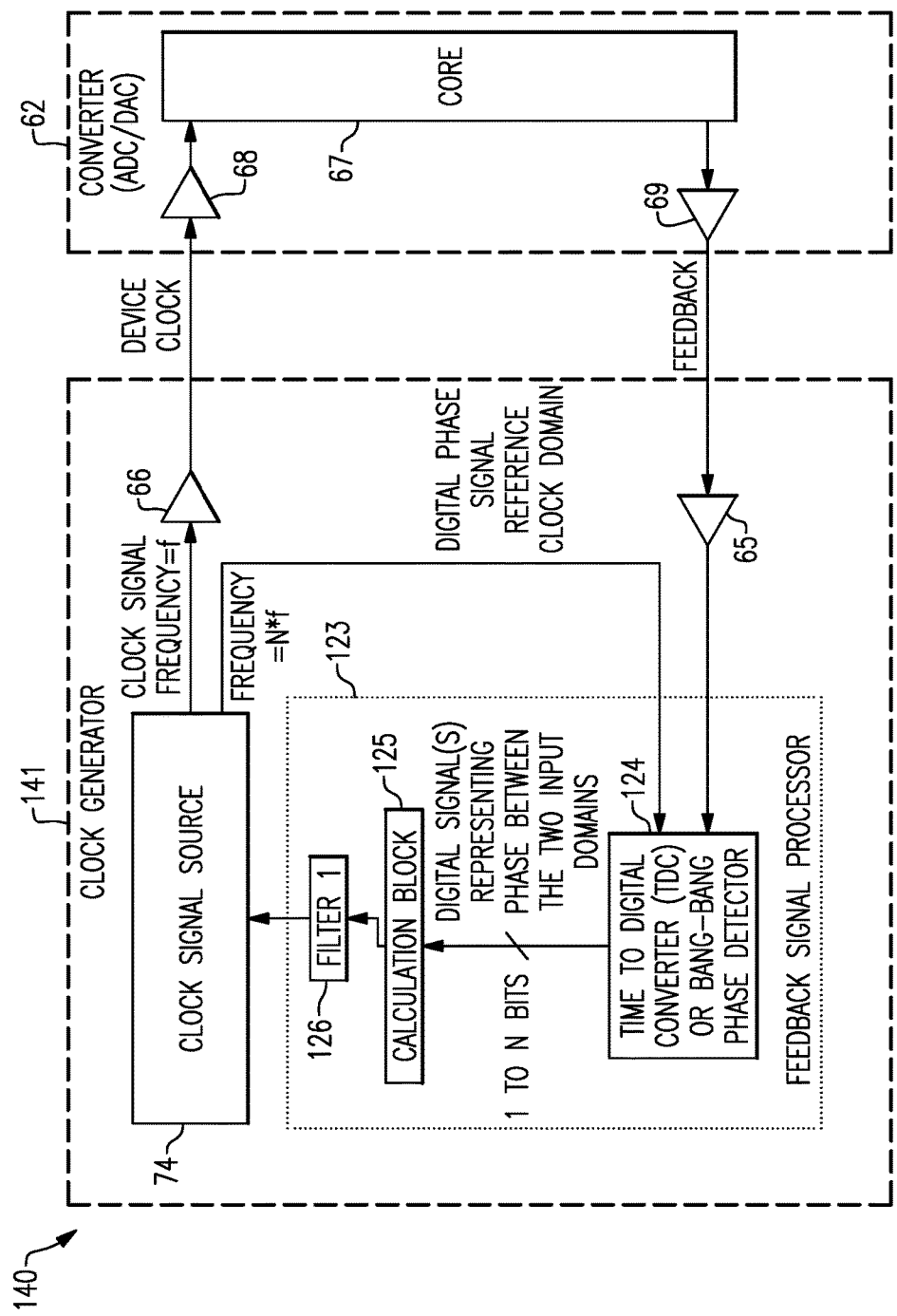
FIG. 14 is a schematic diagram of an electronic system with phase adjustment of a device clock signal in which a reference signal from a clock signal source is provided to the feedback signal processor according to an embodiment.

In certain embodiments, a feedback processor includes a phase processor configured to convert the feedback signal to data in the form of a digital signal. The data can be a single bit, such as generated by a bang-bang phase detector (BBPD), or a multi-bit word, such as generated by a time to digital converter (TDC). A TDC can generate data in the form of digital words that represent time relative to a clock signal source. When used in this manner, the data, which represents phase information, is typically produced relative to another clock signal that has a known relationship to the device clock signal. For example, the other clock signal can be a common higher frequency clock signal that is also being divided down to the device clock signal. Alternatively, the other clock signal can be a common signal, such as a common system clock signal, that is used to derive that higher frequency clock signal. FIGS. 12, 13, and 14 illustrate example electronic systems in which feedback processors include a phase processor configured to convert feedback from a data converter into a digital signal.

FIG. 12 is a schematic diagram of an electronic system 120 with phase adjustment of a device clock signal based on a feedback signal illustrating additional detail of a phase processor according to an embodiment. The illustrated electronic system 120 includes a clock generator 121 that includes a feedback signal processor 123 configured to process the feedback from the data converter 62 into a digital signal representative of phase information associated with the data converter 62. The illustrated feedback signal processor 123 includes a phase processor 124 configured to receive the feedback signal Feedback by way of the input receiver 65 and a digital clock signal. The digital clock signal can have a known relationship to the device clock signal Device Clock.

The feedback processor 124 can be any suitable processor configured to generate a digital signal indicative of a phase associated with the data converter 62 from the feedback provided by the data converter 62. For instance, the feedback processor 124 can be a TDC. The TDC can generate a digital word representative of a phase of the feedback signal Feedback relative to the digital clock signal. The digital word can be provided to the calculation circuit 125 for calculating a phase control signal. As another example, the feedback processor 12.4 can be a BBPD. The BBPD can provide digital phase information associated with the data converter 62 to the calculation circuit 125 for calculating a phase control signal. The output of the calculation circuit 125 can be filtered by a filter 126 (e.g., a low pass filter) and provided to a phase adjustment port of the clock signal source 64.

FIG. 13 is a schematic diagram of an electronic system 130 with phase adjustment of a device clock signal in which a common oscillator provides a reference signal to a clock signal path and a feedback signal processor according to an embodiment. As shown in FIG. 13, a clock generator 131 can include a phase-locked loop and oscillator 132 configured to generate a clock signal. The phase-locked loop and oscillator 132 is an example of a clock signal source and can implement any of the clock signal sources discussed herein. The feedback signal processor 12.3 and the clock signal path 75 can both receive the clock signal from the phase-locked loop and oscillator 132. The phase processor 124 can use the clock signal as a reference signal in processing the feedback signal Feedback from the data converter 62 into phase information, As shown in FIG. 13, the feedback signal processor 124 can provide a phase control signal to a phase adjustment port of the clock signal path 75.

FIG. 14 is a schematic diagram of an electronic system 140 with phase adjustment of a device clock signal in which a reference signal from a clock signal source is provided to the feedback signal processor according to an embodiment. As shown in FIG. 14, a clock generator 141 can include a clock signal source 74 configured to provide an output to the feedback signal processor 123. The phase processor 124 can use the output of the clock signal source 74 as a reference signal in processing feedback from the data converter 62 and providing phase information. As shown in FIG. 14, the feedback signal processor 124 can provide a phase control signal to a phase adjustment port of the clock signal source 74.

Figure 15:
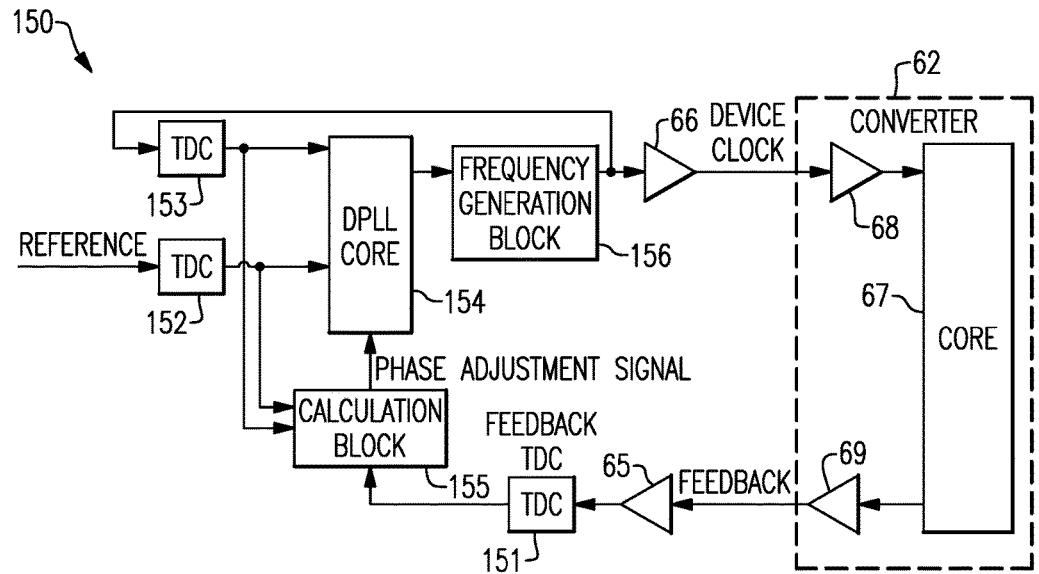
FIG. 15 is a schematic diagram of an electronic system with phase adjustment of a device clock signal that includes time-to-digital converters according to an embodiment.
Figure 16:
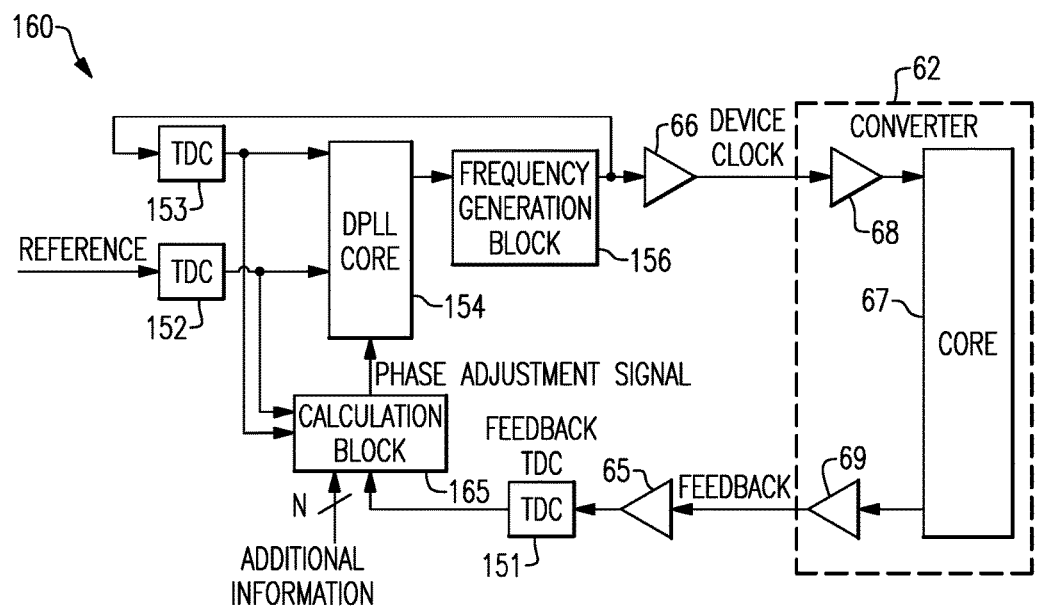
FIG. 16 is a schematic diagram of an electronic system with phase adjustment of a device clock signal that includes time-to-digital converters according to another embodiment.
Figure 17:
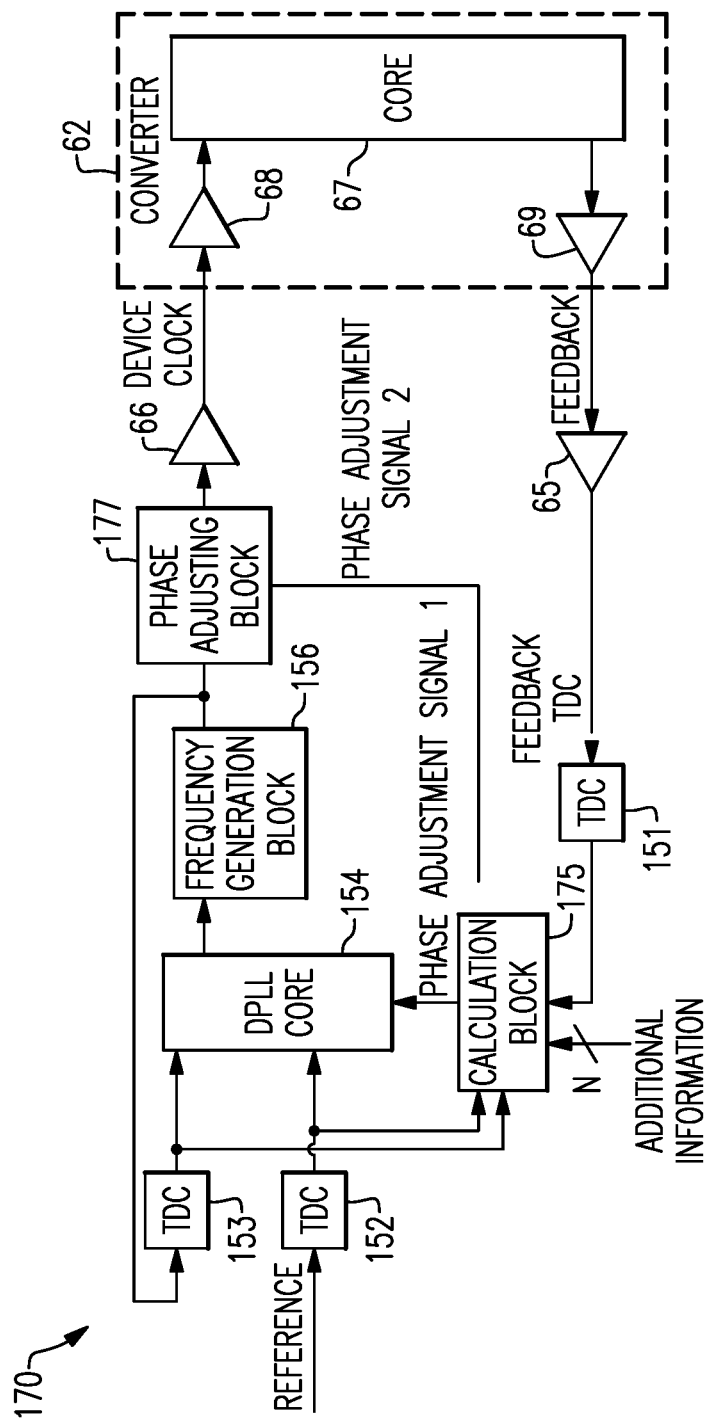
FIG. 17 is a schematic diagram of an electronic system with phase adjustment of a device clock signal that includes time-to-digital converters according to another embodiment.

In certain embodiments, time-to-digital converters (TDCs) can provide information to a calculation circuit of a feedback signal processor. TDCs can produce digital time stamps identifying when an input signal experiences an edge transition relative to a reference signal. The reference signal can be any suitable common reference signal, such as a system clock signal. The differences in the time stamps between two TDCs can be detected and inserted into the loop at the output of the phase detector to compensate for the measured phase difference and/or to provide a desired adjustment behavior, for example. FIGS. 15, 16, and 17 are illustrative examples of electronic systems that include such TDCs.

FIG. 15 is a schematic diagram of an electronic system 150 with phase adjustment of a device clock signal that includes time-to-digital converters according to an embodiment. In the electronic system 150, multiple TDCs 151, 152, and 153 and a digital phase-locked loop (DPLL) including DPLL, core 154 are included. The TDCs 151, 152, and 153 provide data to the calculation circuit 155. The TDCs 152 and 153 can be considered part of the DPLL.

In the electronic system 150, the feedback signal processor includes the TDC 151 and the calculation circuit 155. The TDC 151 can implement a phase processor. The TDC 151 can provide phase information about feedback from the data converter 62 to the calculation circuit 155. Accordingly, the TDC 151 can be referred to as a feedback TDC. The calculation circuit 155 can also receive inputs from the TDCs 152 and 153. The TDC 152 can receive a reference signal Reference and provide a signal to the DPLL core 154 (e.g., to a digital phase detector of the DPLL core) and to the calculation circuit 155. The reference signal Reference can be any suitable reference signal, such as a common system clock signal or another input signal relatively to which measurements can be made. The TDC 153 can be coupled between a frequency generation circuit 156, such as a voltage controlled oscillator, and the DPLL core 154. The TDC 153 can provide a signal to the DPLL core 154 (e.g., to an integer or fractional divider of the DPLL core 154, which can be coupled to either an input or an output of the TDC 153) and to the calculation circuit 155. The calculation circuit 155 can use the signal received from the TDC 152 and/or the signal received from the TDC 153 in computing a phase adjustment signal. The phase adjustment signal can be provided to the DPLL core 154 to cause the device clock signal provided to the data converter 62 to be adjusted.

FIG. 16 is a schematic diagram of an electronic system 160 with phase adjustment of a device clock signal that includes time-to-digital converters according to another embodiment. The electronic system 160 is like the electronic system 150 of FIG. 15 except that the calculation circuit 165 is configured to receive additional information. The calculation circuit 165 can compute a phase control signal based on the additional information. The calculation circuit can compute the phase control signal based on the additional information and other information (e.g., phase information from the TDC 151 and/or information from the TDC 152 and/or the TDC 153). The additional information can include temperature information and/or information from another TDC or calculation circuit associated with a different data converter than the data converter 62. In some other embodiments, the addition information can include any other suitable information from which to compute one or more phase control signals.

FIG. 17 is a schematic diagram of an electronic system 170 with phase adjustment of a device clock signal that includes time-to-digital converters according to another embodiment. The electronic system 170 is like the electronic system 160 of FIG. 16 except that phase adjustment is implemented at more than one point in a clock generating circuit and a phase adjusting circuit 177 is coupled in a signal path between the frequency generation circuit 156 and an output driver 66 of a clock generator. As shown in FIG. 17, a calculation circuit 175 can compute a plurality of phase control signals and provide the phase control signals to different circuitry of the clock generating circuit. As illustrated, the calculation circuit 175 can provide a first phase control signal to the DPLL core 154 and a second phase control signal to a phase adjusting circuit 177. The phase adjusting circuit 177 can include an adjustable delay element, a divider with programmable delay steps, or a delay-locked loop.

By adjusting phase at more than one point of a clock generating circuit, the electronic system 170 can adjust the phase of the device clock signal in different ways. These different ways of adjusting the phase of the device clock signal can have different characteristics. For instance, certain ways of adjusting the device clock signal can have a lower latency than other ways. As another example, certain ways of adjusting the device clock signal can have a higher accuracy than other ways. Adjusting the phase of the device clock signal in different ways can tailor phase adjustment to a particular application and/or to compensating for a particular type of cause that results in different data converters being unsynchronized with each other.

Adjusting the Phase of the Device Clock Signal in the Clock Generator

One or more phase adjustment signals can be provided to a variety of different circuits of the clock generating circuitry of a clock generator to cause a phase of the clock signal provided by the clock generator to be adjusted. FIGS. 18, 19, 20, and 21 provide illustrative examples of clock generating circuitry that can adjust a phase of a device clock signal based on one or more phase control signals. These examples are not exhaustive and a phase control signal can be provided to any suitable circuit of clock generating circuitry to adjust the phase of a device clock signal.

Figure 18:
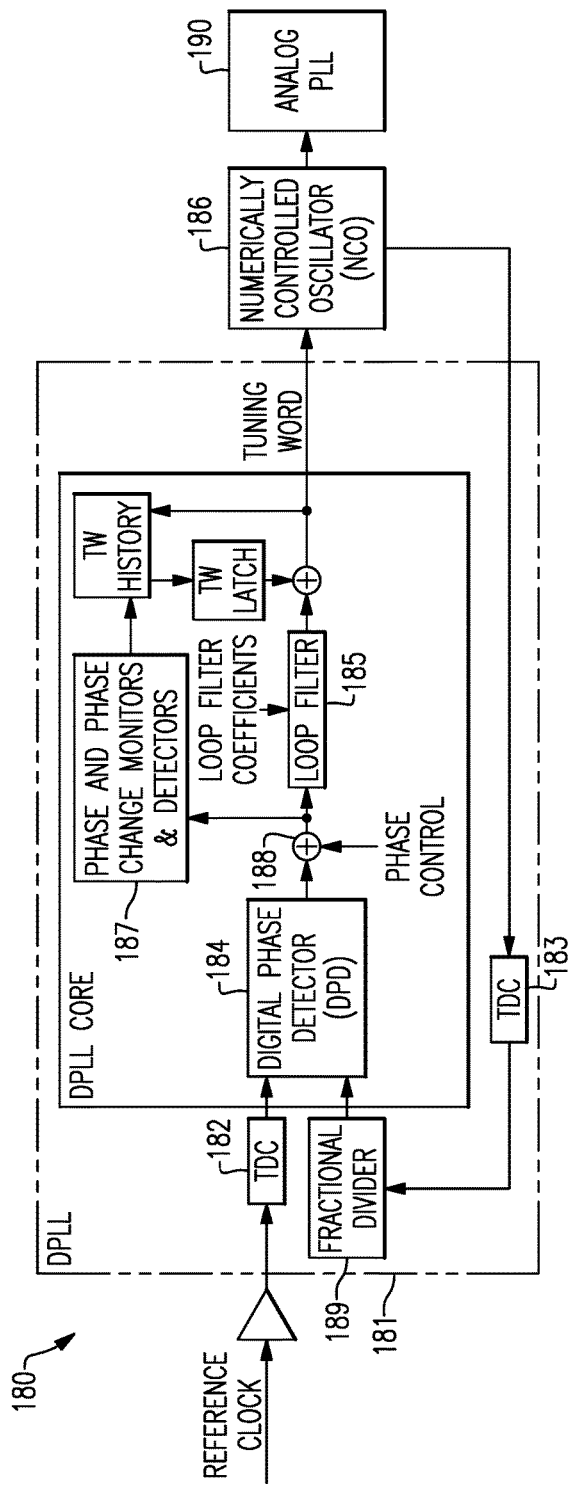
FIG. 18 is a schematic block diagram of an illustrative clock generating circuit that includes a digital phase-lock loop with phase adjustment according to an embodiment.

FIG. 18 is a schematic block diagram of an illustrative clock generating circuit 180 that includes a digital phase-lock loop 181 with phase adjustment according to an embodiment. FIG. 18 shows that a phase control signal Phase Control from a feedback signal processor can be combined with (e.g., added to) an output of a digital phase detector of a phase-locked loop to adjust a phase of a device clock signal.

A digital phase-locked loop (DPLL) is a phase-locked loop implemented using digital circuits. A DPLL can replace traditionally analog components of a phase-locked loop with digital circuits. Some DPLLs include time-to-digital converters (TDCs) that produce digital time stamps identifying when an input signal experiences an edge transition relative to a precise reference signal. For instance, the illustrated DPLL 181 includes TDCs 182 and 183. The information from the TDCs 182 and 183 can be used by a digital phase detector 184 of the DPLL 181 for phase comparison. As illustrated, a divider 189 (e.g., a factional divider as illustrated or an integer divider) can receive an output of the TDC 183 and divide the frequency of the output of the TDC 183 and provided a divided down output to the digital phase detector 184. Because the TDCs 182 and 183 provide digital timing information, the differences in the time stamps between two TDCs 182 and 183 can be determined and inserted into the loop at the output of the phase detector 183 to compensate for the measured phase difference and/or to provide a desired phase adjustment. As illustrated, the TDC 183 can receive an input from the numerically controlled oscillator 186. Alternatively, the input to the TDC 183 can be provided by the analog PLL 190.

The illustrated DPLL 181 also includes a digital loop filter 185 that generates a digital frequency tuning word Tuning Word that drives a numerically controlled oscillator (NCO) 186. An output of the NCO 186 can be provided to an analog PLL 190. An output of the analog PLL 190 can be used to generate a device clock signal. A basic DPLL architecture is shown in FIG. 18. Additional functions can often be included, such as monitors 187 to control the rate of phase change and tuning word history.

The phase of an output of the NCO 186 can be adjusted by adding a phase offset into the digital output signal provided by the digital phase detector 184. As shown in FIG. 18, there is a summer 188 at the output of the digital phase detector 184 to sum the digital output signal with the phase control signal Phase Control. This summing may he performed at a node between the digital phase detector 184 and the digital loop filter 185, as shown in FIG. 18. Similar summing may be performed at an output of the digital loop filter 185 in some other embodiments, which may provide a faster or slower phase adjustment response.

Figure 19:
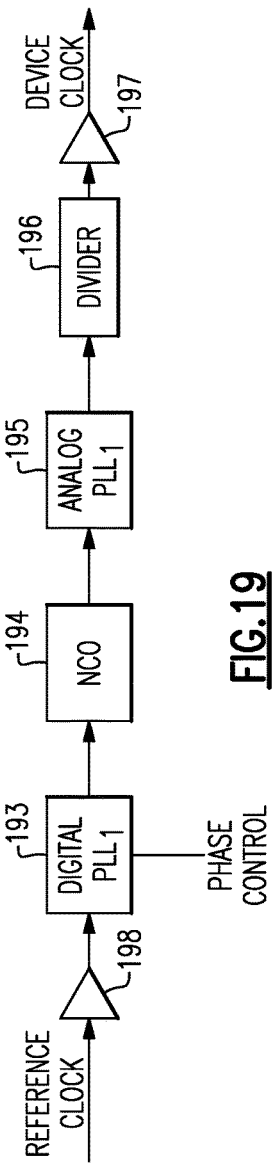
FIG. 19 is a schematic block diagram of a clock generating circuit that includes a digital phase-lock loop with phase adjustment according to another embodiment.

FIG. 19 is a schematic block diagram of a clock generating circuit 192 that includes a digital phase-lock loop (DPLL) 193 with phase adjustment according to another embodiment. FIG. 19 illustrates that the DPLL 193 is included in clock generating circuit 192 that also includes an NCO 194, an analog phase-locked loop (APLL) 195, a divider 196, an output driver 197, and an input driver 198. The phase control signal Phase Control can be provided to the DPLL 193, for example, as described with reference to FIG. 18. Accordingly, the DPLL 193 can adjust a phase of the device clock signal Device Clock provided by the clock generating circuit 192. In some other embodiments, another phase control signal can be provided to the output driver 197 and/or other circuit components of the clock generating circuit 192 to adjust the phase of the device clock signal Device Clock.

The phase of the device clock can be adjusted in a clock signal path of the device clock signal between a clock signal source and an output of a clock generator arranged to provide the device clock signal. Such a clock signal path can include a programmable delay element, which can be updated continuously, and/or a delay-locked loop or a divider with phase adjustment capabilities. The phase control signal can control a delay of a delay element using a control port.

Figure 20:
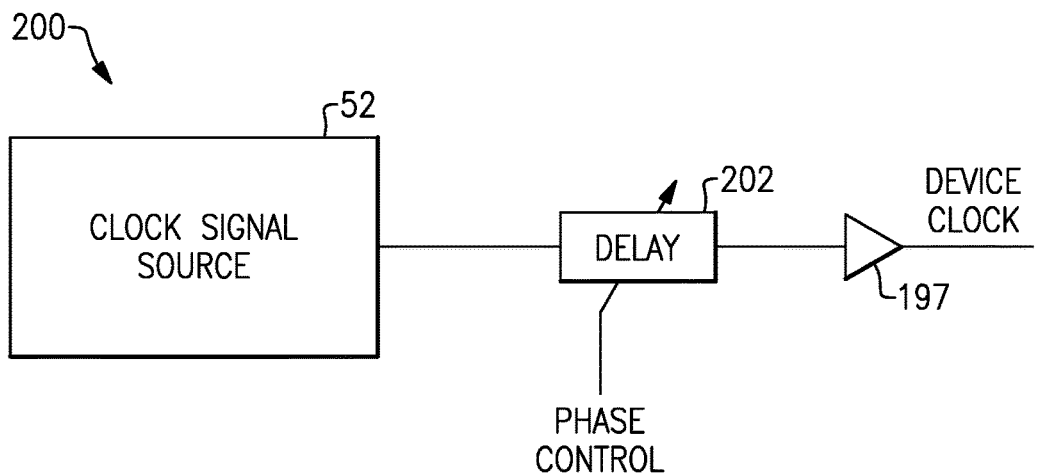
FIG. 20 is a schematic block diagram of a clock generating circuit that includes a delay element with phase adjustment according to an embodiment.

FIG. 20 is a schematic block diagram of a clock generating circuit 200 that includes a programmable delay element 202 with phase adjustment according to an embodiment. As shown in FIG. 20, a phase control signal Phase Control can adjust the delay of the delay element 202 to thereby adjust the phase of the device clock signal Device Clock.

Figure 21:
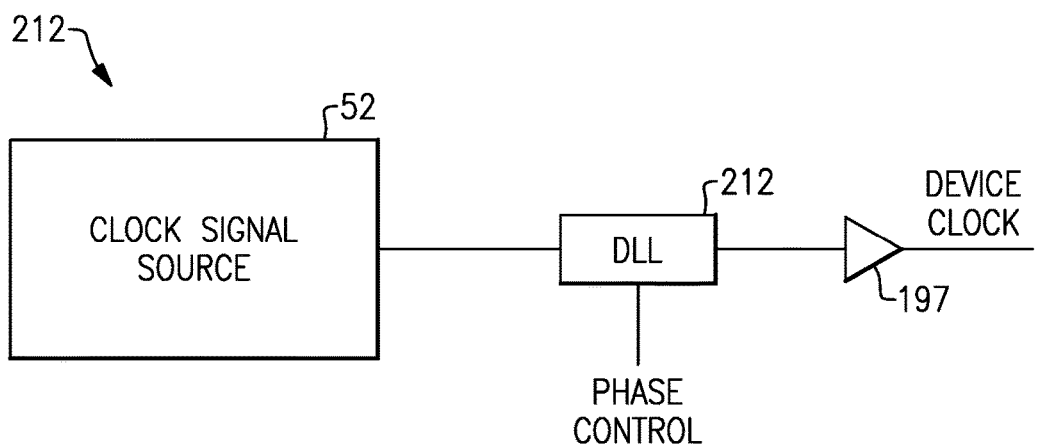
FIG. 21 is a schematic block diagram of a clock generating circuit that includes a delay-lock loop with phase adjustment according to an embodiment.

FIG. 21 is a schematic block diagram of a clock generating circuit 210 that includes a delay-lock loop 212 with phase adjustment according to an embodiment. As shown in FIG. 21, a phase control signal Phase Control can adjust the delay of the delay-locked loop 212 to thereby adjust the phase of the device clock signal Device Clock.

Bi-Directional Interface for Device Feedback

In certain embodiments, a bi-directional electrical connection between a clock generator and a device can provide (1) the feedback signal from the device to the clock generator, and (2) a signal from the clock generator to the device. As such, an existing signal line between the clock generator and the device for providing a signal from the clock generator can provide the feedback signal. The bi-directional signal line can have a reprogrammable signal direction mode to send the feedback signal from the device to the clock generator. Accordingly, feedback can be provided from a device to a clock generator without increasing the number of signal routes between the clock generator and the device. In addition, the clock generator can receive feedback from a device without increasing the number of input/output contacts by implementing a bi-directional interface in certain embodiments.

Some modern cellular communication systems use the JEDEC JESD204B and/or JESD204C standards. One significant goal of these specifications is for synchronization of devices (e.g., converters, transceivers, PLLs, and application specific integrated circuits (ASICs)) in an electronic system. This can be achieved using a device clock signal and a system reference signal, which is referred to as a SYSREF signal in the JESD204B and JESD204C specifications. The SYSREF signal together with the device clock signal can be used to achieve synchronization of the devices in the system. However, the JESD204B and JESD204C standard specify tight timing relationships between the device clock signal and SYSREF signal, which can become increasingly difficult to achieve at higher device clock speeds. These standards also involve an open loop approach to device synchronization. Both of these can bound an amount of synchronization that can be achieved to a coarser level than can be achieved with more advanced techniques.

Previous attempts to improve synchronization in systems operating in accordance with a JESD204 standard have involved creating tight specifications on device clock and SYSREF signals. However, such attempts were open-loop approaches. With open loop approaches, there is no feedback from devices arranged to receive device clock signals. Alternate ideas have involved having a customer pass data information over SPI ports to the different parts. However, accurate phase information (e.g., through the signal edge) may not be available, plus this involves additional complexity for the customer. Both of those methods make it difficult to tightly synchronize multiple data converters and to maintain that synchronization over time. An open-loop synchronization scheme can encounter difficulties tracking timing drift due to temperature, for example. Moreover, it may not be able to achieve tight timing alignment without a closed loop servo mechanism, which can drive alignment toward zero error. To improve synchronization capability beyond the scope of these standards can involve more advanced techniques.

Signals specified by the JESD204B and JESD204C standards typically propagate in a single direction—from the clock generator to the data converters/transceivers. In particular, the JESD204B and JESD204C standards specify that both the device clock signal and the SYSREF signal are unidirectional signals. These signals are typically derived from a common clock generator and sent to the devices for use in synchronizing the devices. In typical JESD 204 system operation, the SYSREF signal flows from a clock generator to another device (e.g., a data converter) to provide synchronization. Often a SYSREF signal can be sent occasionally as desired to provide synchronization, after which is put into a static, or into a power down mode, until desired again.

According to certain embodiments, a system reference signal and a feedback signal can propagate over a bidirectional electrical connection between a clock generator and a device, such as a data converter, a PLL, a communications transceiver, or any other suitable device to be synchronized with another device. For instance, the SYSREF as defined in the JESD 204 specification such as a JESD204B or JESD 204C specification, and a feedback signal can both propagate over a bidirectional electrical connection between a clock generator and a device. The feedback signal and the SYSREF signal can propagate over the same electrical connection at different times. In some instances, the signal wires can be differential and each signal can propagate in a different direction in a single one of the differential wires concurrently. A device to be synchronized (e.g., a data converter) can receive synchronization information from the clock generator device and provide a feedback signal back to the clock generator device by way of a bi-directional interface. The clock generator can also include a bi-directional interface configured to provide the SYREF signal for a device and to receive a feedback signal from the device.

Dynamic control of the direction of the bi-directional electrical connection can be automatic (e.g., after transmission of the SYSREF signal as defined in a JESD 204 standard) and/or via an external control (e.g., via a separate control interface like a serial peripheral interface (SPI) port). Additional capabilities such as improved synchronization, phase control, phase tracking and communication, the like, or any combination thereof can be enabled using such a bi-directional interface. Through the use of embedding data on the feedback signal, the device is also able to pass information such as its silicon temperature information back and/or information about the internal phase of one or more digital counters to the clock generator's feedback signal processor.

Accordingly, existing signal lines in accordance with a JESD204 standard (e.g., JESD204B or JESD204C) can allow an electronic system to operate with feedback of phase information (e.g., using the signal edge location or by passing phase information as digital data) from one or more data converters back to a clock generator. In some embodiments, improved synchronization of multiple devices in the system can be enabled using this method. Examples include automatic synchronization of a signal chain and compensation/tracking for phase change over temperature.

In an embodiment, a clock generator includes a bi-directional interface, a system reference circuit, and a feedback signal processor. The bi-directional interface is configured to electrically communicate with a device. The system reference circuit can generate a system reference signal. The bi-directional interface can transmit the system reference signal from the clock generator to the device. The bi-directional interface can receive a feedback signal from the device. The feedback signal processor can process the feedback signal from the device.

The bi-directional interface can enable the clock generator to transmit the system reference signal and receive the feedback signal at a common input/output contact of an integrated circuit device. The system reference signal can be a SYSREF signal in accordance with a JESD204 standard, such as JESD204B or JESD204C. The clock generator can enable transmission by way of the bi-directional interface in a first mode and enable receiving by way of the bi-directional interface in a second mode. A third mode can allow simultaneous communication in both directions, such as when the interface uses two wires (e.g. an LVDS or other differential signaling format such as can be used in JESD204B/C systems with the SYSREF signal). In the third mode, one of the differential wires can transmit data to the clock generator and another wire can transmit the data from the clock generator to a data converter. An example of this would be using LVDS mode for the SYSREF signaling mode, and a universal asynchronous receiver/transmitter (UART) mode for each wire in a third simultaneous bi-directional mode. Alternatively, the third mode could be a two wire interface such as that defined by the I2C/I3C standard. A control circuit can control the bi-directional interface to toggle between operating in the first mode and operating in the second mode or third mode. The clock generator can also provide a device clock signal to the device. The feedback signal processor can adjust a phase of the device clock signal based on the feedback signal. This can synchronize the device with one or more other devices. The device can be a data converter, for example.

In another embodiment, a data converter includes a bi-directional interface, a feedback circuit, and a data conversion circuit. The bi-directional interface is configured to electrically communicate with a clock generator. The feedback circuit can generate a feedback signal that includes phase and/or data information associated with the data converter. The bi-directional interface can transmit the feedback signal from the data converter to the clock generator. The bi-directional interface can receive the system reference signal from the clock generator. The data conversion circuit can use the system reference signal as a reference signal.

The bi-directional interface can enable the data converter to transmit the feedback signal and to receive the system reference signal at a common input/output contact (or contacts in the case of a differential signal) of an integrated circuit device. The system reference signal can be a SYSREF signal in accordance with a JESD204 standard, such as JESD204B or JESD204C. The data converter can enable transmission by way of the bi-directional interface in a first mode and enable receiving by way of the bi-directional interface in a second mode. In a third mode, the bi-directional interface allows for simultaneous transmission and receiving over differential signals lines. A control circuit can control the bi-directional interface to toggle between operating in any mode and any other mode. The data converter can also receive a device clock signal from the clock generator. The feedback signal can cause the clock generator to adjust a phase of the device clock signal. The data converter can be an analog-to-digital converter or a digital-to-analog converter, for example. The data conversion circuit can perform any suitable data conversion in such data converters.

According to another embodiment, an electronic system includes a clock generator and a device. The clock generator and the device are electrically connected to each other. The clock generator is configured to provide a device clock signal to the device. The clock generator is configured to provide a system reference signal to the device. The device is configured to provide a feedback signal to the clock generator. The feedback signal and the system reference signal can propagate over the same electrical connection between the clock generator and the device. The clock generator can adjust a phase of the device clock signal based on the feedback signal. This can better synchronize the device with one or more other devices.

The clock generator can provide respective device clock signals to the one or more other devices. The system reference signal can be a SYREF signal in accordance with a JESD204 standard, such as a JESD204B standard or a JESD204C standard. The device can be a data converter.

Illustrative electronic systems in which a system reference signal and a feedback signal propagate over a bi-directional electrical connection will now be described. Any suitable combination of features of these embodiments can be combined with each other and/or any suitable combination of features of other embodiments. Such systems can include a clock generator and one or more devices, such as data converters, in accordance with any suitable principles and advantages discussed herein. While some embodiments may be described with reference to an electronic system with a clock generator and a data converter, any of the principles and advantages of these embodiments can be applied to electronic systems that include two or more data converters and/or other devices arranged to receive device clock signals and system reference signals.

Figure 22:
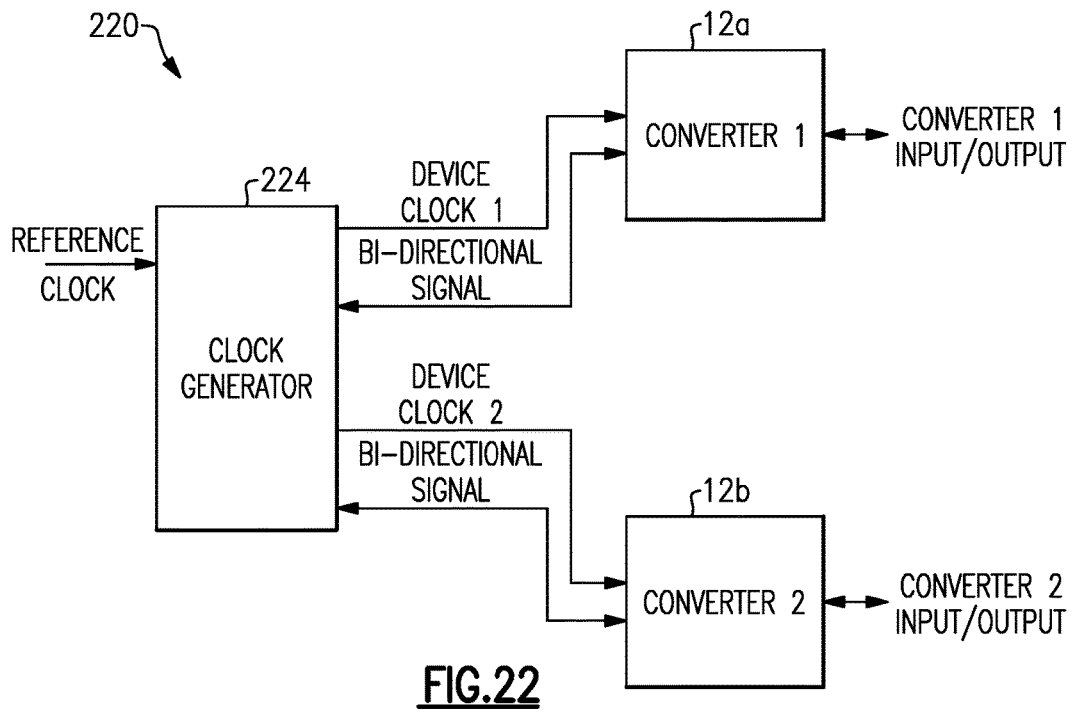
FIG. 22 is a schematic diagram of an electronic system with phase adjustment of a device dock signal in which a feedback signal from the device is provided to a bi-directional interface according to an embodiment.

FIG. 22 is a schematic diagram of an electronic system 220 with phase adjustment of a device clock signal in which a feedback signal from a device is provided to a bi-directional interface of a clock generator according to an embodiment. FIG. 22 illustrates that a bi-directional signal line can provide a SYSREF signal from a clock generator 224 to a data converter 12a and the data converter 12a can provide a feedback signal to the clock generator 224 over the same signal line. Bi-directional signal lines can provide electrical connections between the clock generator 224 and any suitable number of data converters 12a and 12b.

Figure 23:
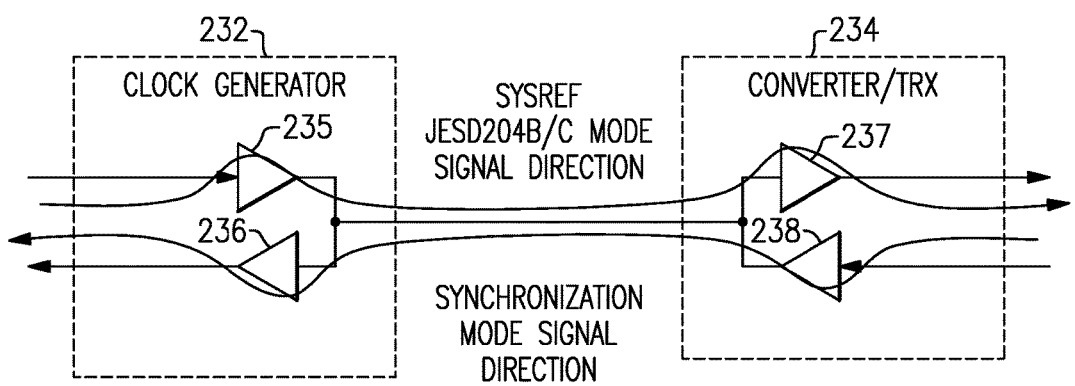
FIG. 23 is a schematic diagram illustrating signal propagation over a bi-directional interface according to an embodiment.

FIG. 23 is a schematic diagram illustrating signal propagation over a bi-directional interface according to an embodiment. As shown in FIG. 23, the clock generator 232 can provide a SYSREF signal to a data converter 234 and the data converter 234 can provide feedback to the clock generator 232 over the same signal line. In particular, an output driver 235 of the clock generator 232 can provide a SYREF signal to an input receiver 237 of the data converter 234. Additionally, an output driver 238 of the data converter 234 can provide a feedback signal to an input driver 236 of the clock generator 232.

The output driver 235 of the clock generator 232 and the input receiver 237 of the data converter 234 can be enabled in a first mode of operation. The input driver 236 of the clock generator 232 and the input driver 238 of the data converter 234 can be enabled in a second mode of operation. An electronic system can dynamically control whether the system operates in the first mode of operation or the second mode of operation. Such dynamic control can be automatic and/or responsive to a signal provided to the clock generator 232 and/or the data converter 234. In some instances, the signals can propagate over the bi-directional interface in both directions concurrently by way of differential signal lines in another mode of operation.

A bi-directional signal line can allow the device being synchronized (e.g., a DAC or an ADC) to send a feedback signal that comprises phase information to a clock generator. The feedback signal can alternatively or additional comprise data about the device's die temperature, internal states, any other suitable information, or any combination thereof. In some embodiments, information can be sent from the clock generator to the device being synchronized by another way of changing direction (e.g., via a separate control interface such as a SPI port or through control signals sent over the interface).

FIG. 24 is a schematic diagram of an electronic system 240 including a clock generator 244 and data converter 242 having bi-directional interfaces according to an embodiment. As illustrated, the data converter 242 includes a clock signal and data pattern generator circuit 246 and a clock signal receiver, data pattern detector and decoder circuit 245. The clock signal and data pattern generator circuit 246 can process feedback from the converter core 67 for transmitting to the clock generator 244 by way of the output driver 238. For instance, the clock signal and data pattern generator circuit 246 can encode information into a feedback signal for the clock generator 244. The clock signal receiver, data pattern detector and decoder circuit 245 can process the SYSREF signal from clock generator 244 for providing to the converter core 67.

As shown in FIG. 24, the clock generator 244 can include a clock signal and data pattern generator circuit 247 and a data pattern detector and decoder circuit 248. The clock signal and data pattern generator circuit 247 can process a signal from the clock generator core 249 for transmitting the SYSREF signal to the data converter 242. The data pattern detector and decoder circuit 248 can process the feedback signal from the data converter 242 provided to the clock generator core 249. For instance, the data pattern detector and decoder circuit 248 can decode information from the feedback circuit, such as temperature information associated with a die of the data converter 242, and provide the decoded information to the clock generator core 249 (e.g., to a calculation circuit configured to compute a phase control signal).

FIG. 25 is a schematic diagram illustrating signal propagation in the system of FIG. 24. As shown in FIG. 25, a signal can propagate from the clock generator 244 to the data converter 242 by way of a bi-directional interface in a SYSREF mode. As also shown in FIG. 25, a signal can propagate from the data converter 242 to the clock generator 244 in a synchronization mode. In some instances, the signals can propagate over the bi-directional interface in both directions concurrently by way of differential signal lines in another mode of operation.

With a bi-directional interface between a clock generator and a data converter, several modes of operation can be implemented. One or more of the following example modes can be implemented. For instance, a pulse-width modulated data mode can be implemented, in which one edge of a signal is modulated in time and represents data information. Support for modulation on both the device clock and bi-directional SYSREF signal can be implemented. As another example, two-wire data communication modes (for, example in a mode similar to I2C), in which a traditional JESD204B/JEDC204C device clock signal acts like the data clock or contains data on a modulated edge can be implemented. As another example, a single wire communication mode, similar to a UART interface, in which one of the lines is used for UART receive or transmit can be implemented. Pulse-width modulated signals on the SYSREF and/or device clock signals can allow for operation in this mode while the other edge of these signals can be used for a different purpose. As yet another example, a spread spectrum modulation mode of operation with either or both signals can be implemented.

Providing Phase Adjustment Signal to Device

In some embodiments, one or more phase control signals from a feedback signal processor can be sent to a data converter to adjust a phase of a signal on the data converter. A variety of methods can be used to send one or more phase control signals to the data converter. Some example methods include communication via a SPI, communication through an intermediary device, or embedding information as data on the device clock or SYSREF signal lines through pulse-width modulation.

Figure 26:
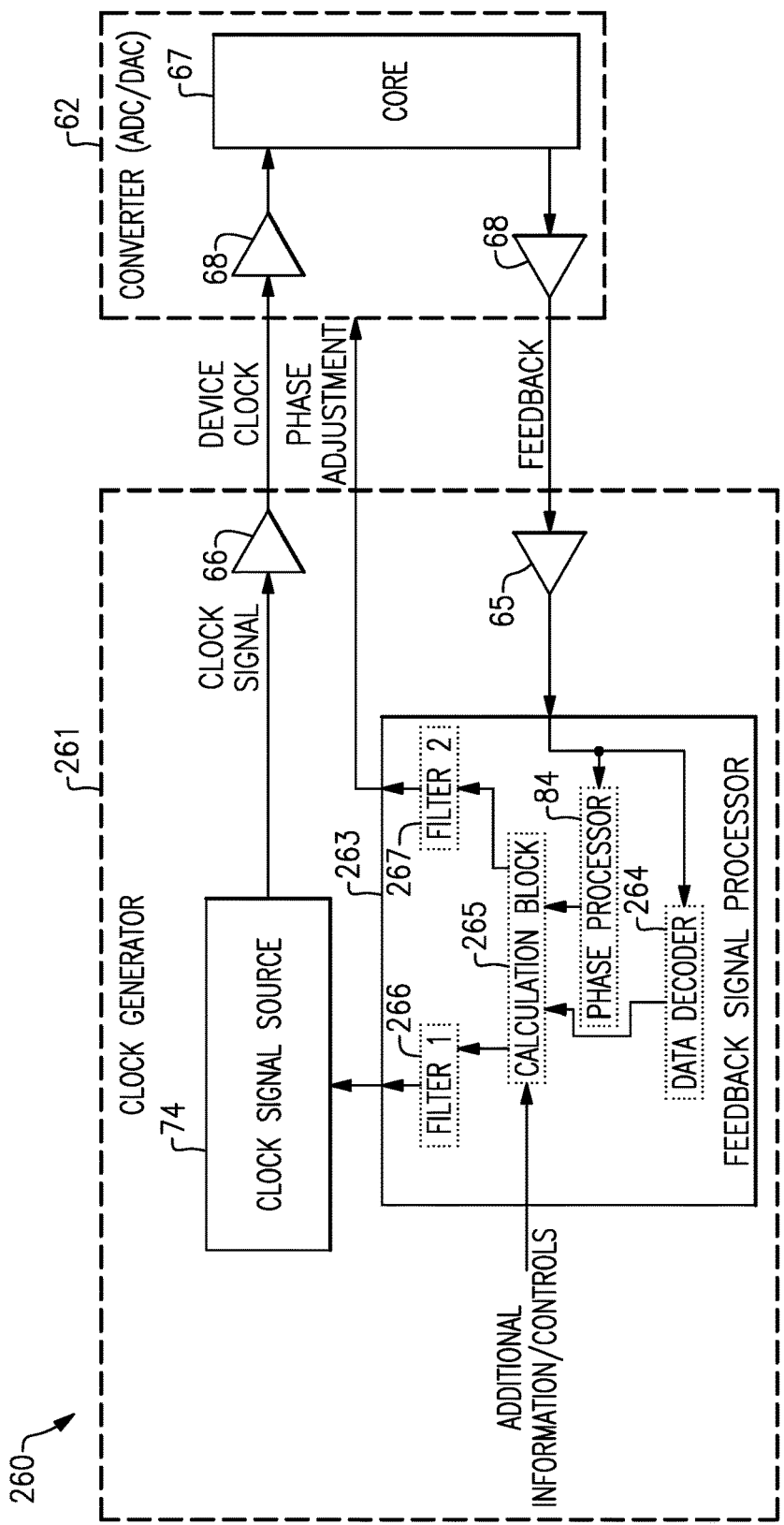
FIG. 26 is a schematic diagram of an electronic system with device clock phase adjustment in which a device is configured to receive the device clock and a phase adjustment signal according to an embodiment.

FIG. 26 is a schematic diagram of an electronic system 260 with device clock phase adjustment in which a device is configured to receive the device clock Device Clock and a phase control signal Phase Adjustment according to an embodiment. As shown in FIG. 26, a clock generator 261 can provide a phase control signal Phase Adjustment to the data converter 62. The clock generator 261 includes a feedback signal processor 263 configured to generate the phase control signal Phase Adjustment to cause a phase of the data converter 62 to be adjusted. The feedback signal processor 263 includes a calculation circuit 265 configured to compute an output based on one or more of phase information from a phase processor 84, decoded data from the data converter provided by a data decoder 264, or additional information. The output of the calculation circuit 265 can be filtered by filter 267 and provided to the data converter 62 as a phase adjustment signal. The phase control signal Phase Adjustment can cause phase adjustment on the data converter 62 in accordance with any suitable principles and advantages discussed herein.

Adjusting Phase of Device Clock Signal Based on Feedback from Multiple Devices

In some instances, synchronization of data converters can involve alignment of their input device clock signals at respective inputs of the data converters. However, in other situations, it can be desirable to adjust a phase of one or more device clock signals at one or more respective inputs of the data converters such that at least one of the device clock signals is misaligned with one or more of the other device clock signals. In such situations, a calculation circuit can implement more complicated calculations that take into account variations and/or effects unique to one or more specific data converter devices in order to achieve synchronization. For example, to maintain synchronization relative to a sampling node of each analog-to-digital converter, compensation can be implemented to reduce or eliminate errors or other variation in the paths on each analog-to-digital converter's on-chip clock path.

In certain embodiments, a calculation circuit of a feedback signal processor can receive information from another feedback signal processor associated with another data converter. For instance, information from a calculation circuit, a data decoder, a phase processor, or any combination thereof can be provided from one feedback signal processor to another. Moreover, information from some or more other feedback signal processors associated with other data converters can be provided to a calculation circuit of a feedback signal processor. Information associated with another feedback signal processor can be used together with any combination of other information provided to a calculation circuit discussed herein to compute one or more phase control signals.

A calculation circuit can use information from a different feedback signal processor to determine the phase relationship between different data converters in an electronic system.

Information indicative of the phase relationship between different data converters can be used to maintain a desired phase relationship between two or more data converters. In some embodiments, this can involve multiple feedback signal processors in accordance with any of the principles and advantages discussed herein.

According to certain embodiments, the calculation circuit of a feedback signal processor can be adaptive in nature. In such embodiments, a desired mathematical relationship can be determined responsive to monitoring various inputs to the calculation circuit in order to determine a desired response that provides desired converter synchronization. For example, the calculation circuit can monitor the feedback phase information of its associated converter relative to the phase information from other converters in order to determine a mathematical response that synchronizes multiple converters over changes in temperature on all the components.

Figure 27:
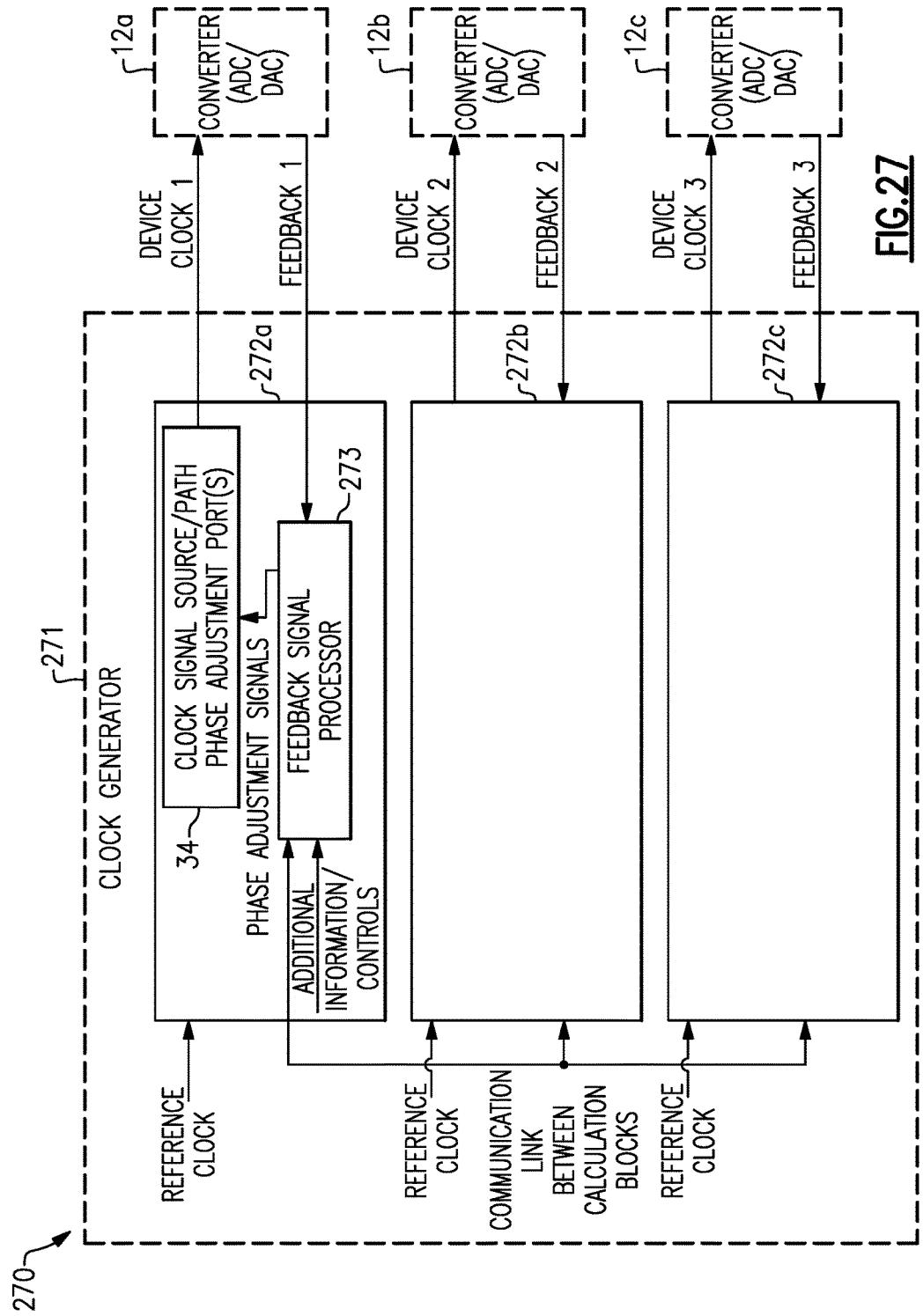
FIG. 27 is a schematic diagram of an electronic system that includes multiple feedback signal processors and clock generating circuits according to an embodiment.

FIG. 27 is a schematic diagram of an electronic system 270 that includes multiple feedback signal processors and clock generating circuits according to an embodiment. In electronic system 270, a clock generator 271 includes a plurality of clocking circuits 272a, 272b, and 272c. Each of the clocking circuits 272a, 272b, and 272c includes a feedback signal processor 273 and a clock generating circuit 34. Each feedback signal processor 273 can receive information from a feedback signal processor of a different clocking circuit. This can provide information from one feedback signal processor to another feedback signal processor. The calculation circuit of the feedback signal processor 273 can compute a phase control signal based on the information from another feedback signal processor. The calculation circuit of the feedback signal processor 273 can alternatively or additionally compute a phase control signal based on feedback from a data converter 12a and/or additional information. While three clocking circuits with separate feedback signal processors and clock generating circuits are shown in FIG. 27, any suitable number of clocking circuits with separate feedback signal processors and clock generating circuits can be implemented. In some embodiments, only a subset of feedback signal processors of clocking circuits of the clock generator 271 can be arranged to receive feedback from another feedback signal processor. The clock generator 271 can be a single integrated circuit device.

Figure 28:
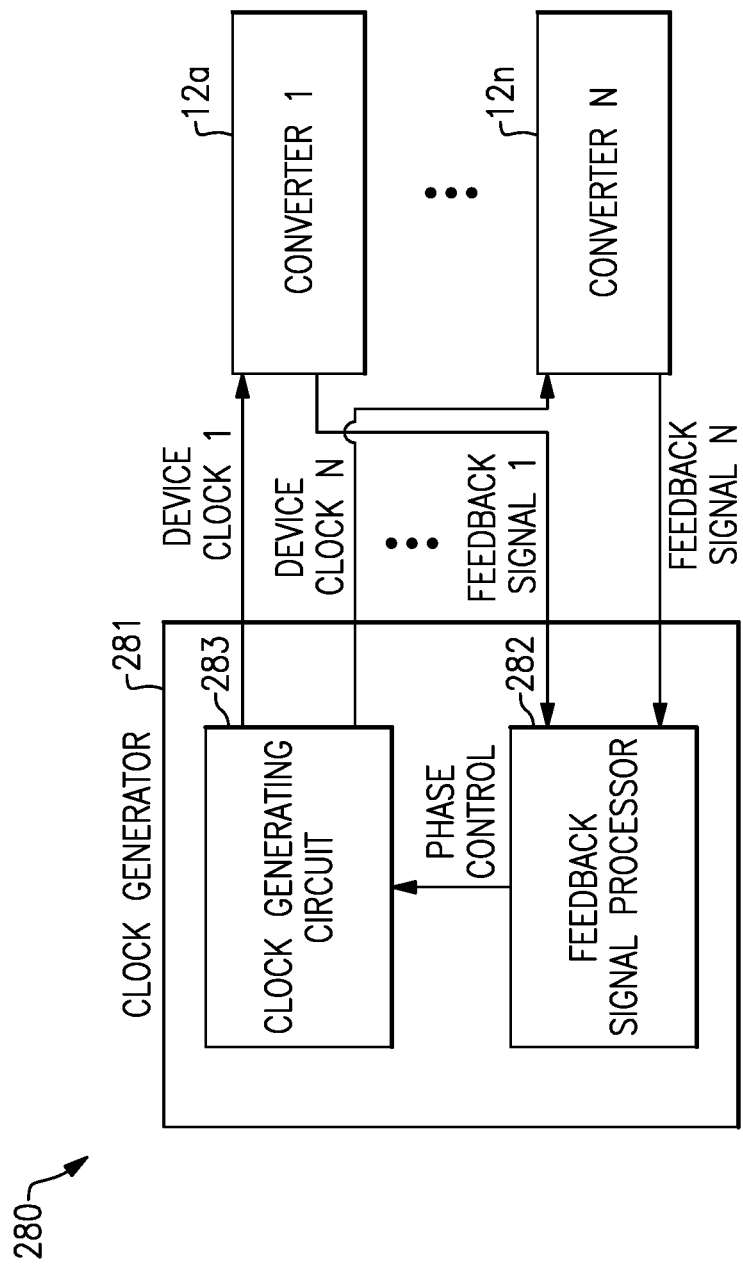
FIG. 28 is a schematic diagram of an electronic system that includes a feedback signal processor arranged to process feedback signals from multiple devices according to an embodiment.

FIG. 28 is a schematic diagram of an electronic system 280 that includes a feedback signal processor 282 arranged to process feedback signals from multiple devices according to an embodiment. For instance, the feedback signal processor 282 can receive feedback signals Feedback 1 to Feedback N from data converters 12a to 12n, respectively. The feedback signal processor 282 can provide one or more phase control signals Phase Control to a clock generating circuit 283 to adjust a phase associated with one or more device clock signals Device Clock 1 to Device Clock N. Alternately, one or more of the phase control signals can be sent to one or more converters through a communications link (e.g. SPI, I2C, bi-directional SYSREF link, or through a third intermediate device like and FPGA). The clock generating circuit 283 can generate multiple device clock signals for respective data converters.

In some embodiments, there is not a direct 1:1 correlation between a device clock and system reference signal (e.g., SYSREF signal) pair from the clock generator and a feedback signal from a device arranged to receive the device clock and system reference signal pair. Multiple feedback signals can be provided for a device clock and system reference signal pair. According to certain embodiments, the feedback signal can be provided to a clock generator by way of a shared bus, in which one feedback signal is active at a time.

A clock generator typically generates multiple device clock and system reference signals on the same integrated circuit device. According to some embodiments, another integrated circuit device (e.g., a buffer or a device with additional capabilities) can provide a device clock signal and a system reference signal from the clock generator integrated circuit device to a device configured to provide a feedback signal to the clock generator integrated circuit device. In some instances, an intermediate device coupled between the clock generator and the device can use one or more phase control signals to adjust a phase of a clock signal from the clock generator that is received by the device by way of the intermediate device. For example, the intermediate device can include a delay lines for a device clock signal and a phase adjustment signal can adjust a phase of the device clock signal by controlling the delay line.

Figure 29:
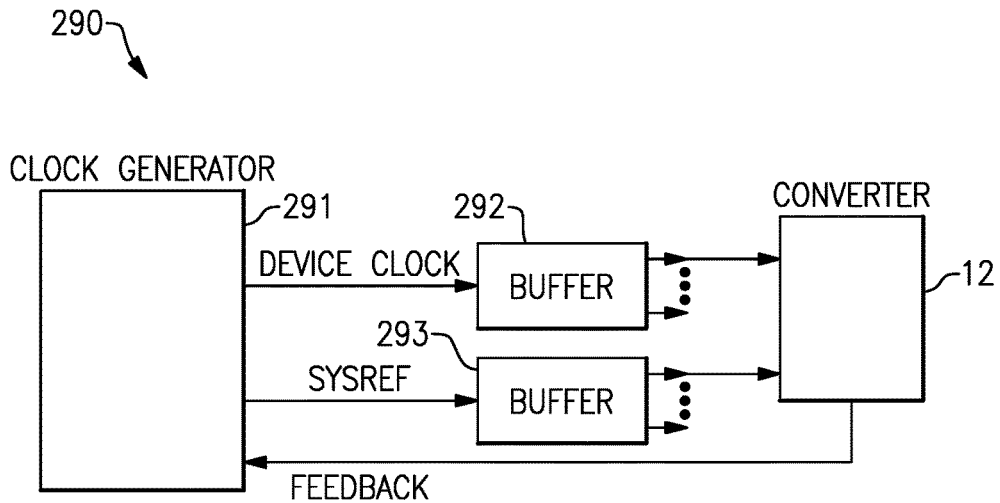
FIG. 29 is a schematic diagram of an electronic system with device clock phase adjustment in which a buffer is configured to buffer a device clock signal and a system reference signal according to an embodiment.
Figure 30:
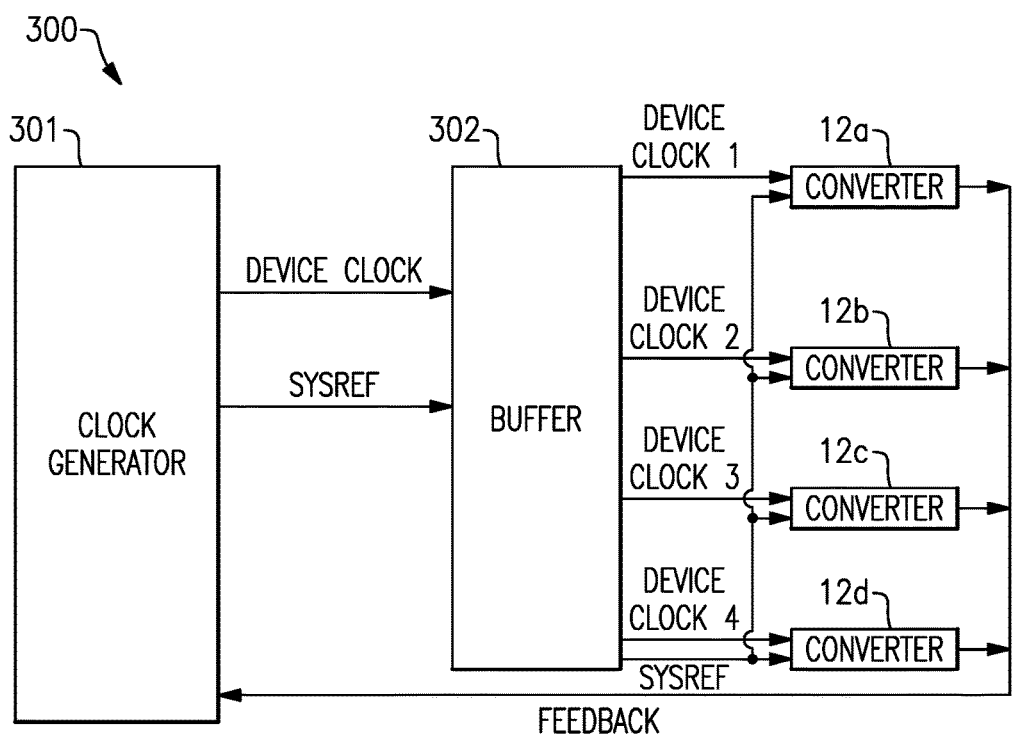
FIG. 30 is a schematic diagram of an electronic system with device clock phase adjustment that includes a buffer and a bus to provide a feedback signal according to an embodiment.

FIG. 29 is a schematic diagram of an electronic system 290 with device clock phase adjustment in which a buffer is configured to buffer a device clock signal and a system reference signal according to an embodiment. FIG. 29 illustrates that one or more signals provided by a clock generator can be fanned out to a plurality of devices. In the electronic system 290, a clock generator 291 can provide a device clock signal Device Clock to a data converter 12 by way of a butler 292. The buffer 292 can also provide the device clock signal Device Clock to one or more other devices. The buffer 292 can be implemented on a different integrated circuit device than the clock generator 291 and the data converter 12. The clock generator 291 can provide a system reference signal SYSREF to the data converter 12 by way of a buffer 293. The buffer 293 can also provide the system reference signal SYSREF to one or more other devices. The buffer 293 can be implemented on a different integrated circuit device than the clock generator 291 and the data converter 12. In some other implementations, the buffer 292 and buffer 293 can be implemented as a single device capable of buffering both signals, FIG. 30 is a schematic diagram of an electronic system 300 with device clock phase adjustment that includes a buffer and a bus to provide a feedback signal according to an embodiment. As illustrated, the electronic system includes a clock generator 301, a buffer 302, and a plurality of data converters 12a to 12d configured to provide feedback to the clock generator 301 by way of a bus. The buffer 302 can buffer signals in signal paths between the clock generator 301 and respective data converters 12a to 12d. FIG. 30 illustrates that a common system reference signal SYSREF can be provided to a plurality of different data converters 12.a to 12d configured to receive different device clock signals Device Clock 1 to Device Clock 4, respectively. Alternately, a buffer could be configured to provide separate SYSREF signals to each converter instead of using a shared bus. The clock generator 301, the buffer 302, and each of the converters 12a to 12d can be different integrated circuit devices. Communication over a SPI or as data embedded in the device clock signals Device Clock 1 to Device Clock 4 or the SYSREF signal can control which data converter 12a to 12d has control of the feedback signal interface.

Figure 31:
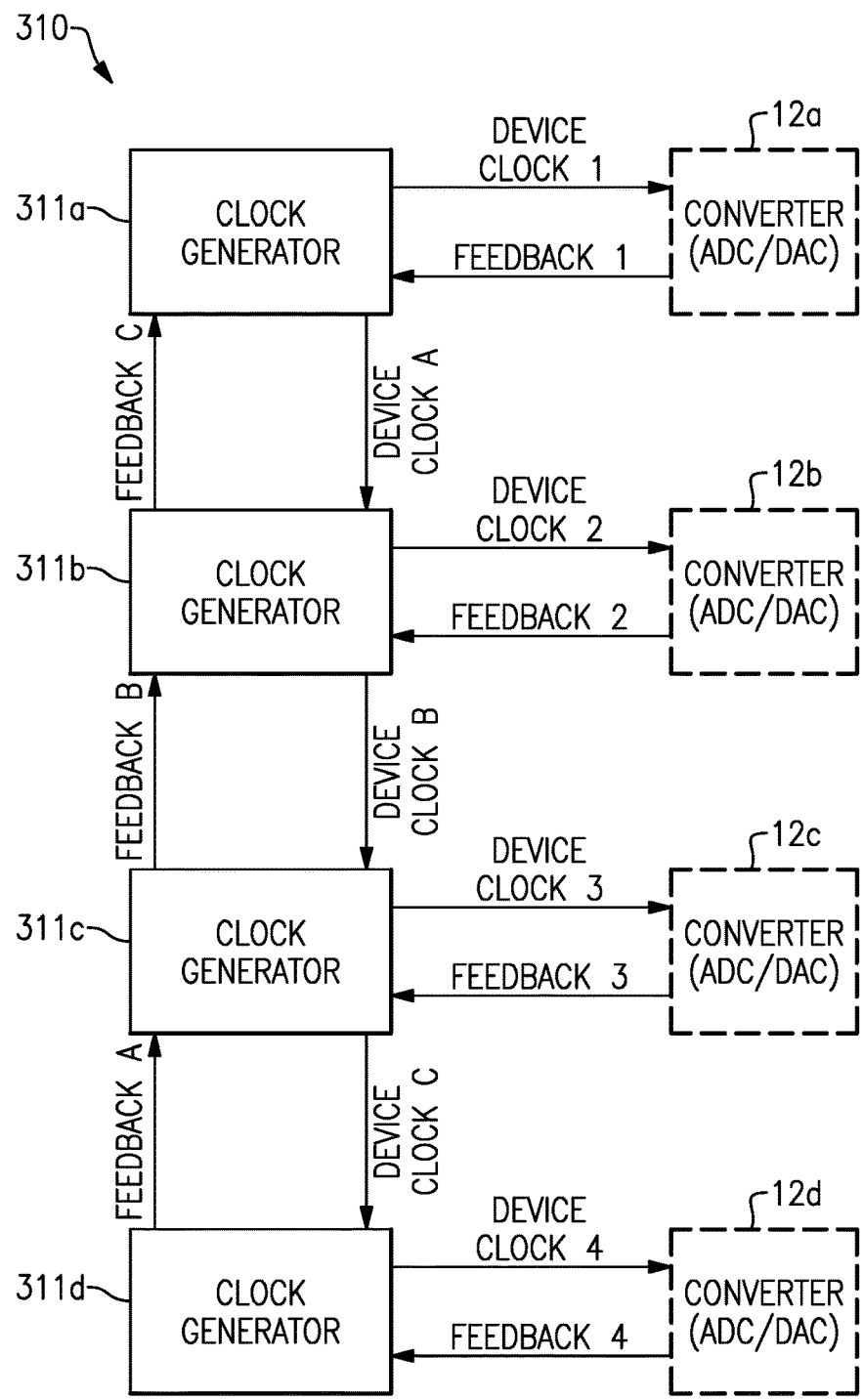
FIG. 31 is a schematic diagram of an electronic system that includes multiple clock generators arranged in a daisy chain according to an embodiment.

FIG. 31 is a schematic diagram of an electronic system 310 that includes multiple clock generators 311a to 311d arranged in a daisy chain according to an embodiment. Each of these clock generators 311a to 311d can be separate integrated circuit devices. Clocking circuits, such as the clocking circuits 272a to 272c of FIG. 27, each including a clock generating circuit and a feedback signal processor can similarly be arranged in a daisy chain on a common clock generator integrated circuit device. In some instances, the clock generators 311a to 311d can be implemented similarly to the clock generator 271 of FIG. 27 with multiple instantiations of clocking circuit 272a. The feedback signals Feedback A to Feedback C provided from one clock generator to another clock generator can include any suitable feedback information, such as feedback information from a data converter and/or feedback information from a clock generator.

Figure 32:
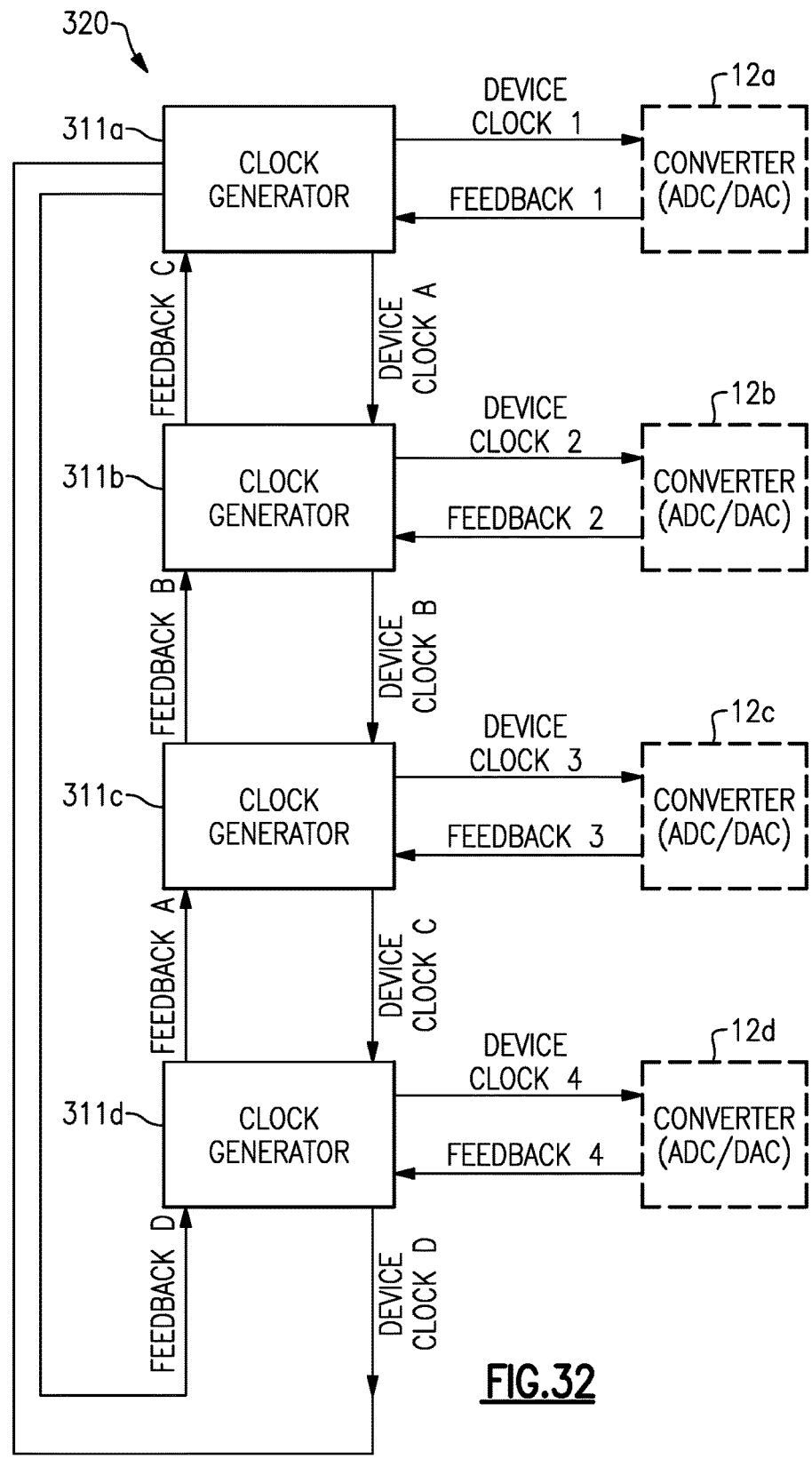
FIG. 32 is a schematic diagram of an electronic system that includes multiple clock generators arranged in a ring according to an embodiment.

FIG. 32 is a schematic diagram of an electronic system 320 that includes multiple clock generators 311a to 311d arranged in a ring according to an embodiment. Each of these clock generators 311a to 311d can be separate integrated circuit devices. Clocking circuits, such as the clocking circuits 272a to 272c of FIG. 27, each including a clock generating circuit and a feedback signal processor can similarly be arranged in a ring on a common clock generator integrated circuit device. In some instances, the clock generators 311a to 311d can be implemented similarly to the clock generator 271 of FIG. 27 with multiple instantiations of clocking circuit 272a. The feedback signals Feedback A to Feedback D provided from one clock generator to another clock generator can include any suitable feedback information, such as feedback information from a data converter and/or feedback information from a clock generator.

In the electronic systems shown in FIGS. 31 and 32, connecting multiple clock generators 311a to 311d together (e.g., in a daisy chain or in a ring) can enable phases associated to the devices 12a to 12d to be synchronized relative to each other. The clock generator devices 311a to 311n can communicate with each other, for example, over a SPI, an I2C, or through the information embedded on the links, such as when the feedback signal is implemented as a bi-directional signal to allow a system reference signal SYSREF and the feedback signal to propagate over the same link. Accordingly, a calculation circuit of a feedback signal processor of a clock generator can determine a desired phase response in order to achieve a target behavior based on information from another clock generator. This can calibrate the clock generators. Accordingly, this can enable a self-calibration and/or an automatic calibration of the system without an external processor.

Applications

Any of the principles and advantages discussed herein can be applied to other systems, not just to the systems described above. The elements and operations of the various embodiments described above can be combined to provide further embodiments. Some of the embodiments described above have provided examples in connection with clock generators and data converters. However, the principles and advantages of the embodiments can be used in connection with any other systems, apparatus, or methods that could benefit from any of the teachings herein. For instance, any of the principles and advantages discussed herein can be implemented in connection with any devices with a need to synchronize with each other.

Aspects of this disclosure can be implemented in various electronic devices. Examples of the electronic devices can include, but are not limited to, consumer electronic products, parts of the consumer electronic products such as semiconductor die and/or packaged modules, electronic test equipment, wireless communication devices, personal area network communication devices, cellular communications infrastructure such as a base station, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

CONCLUSION

Unless the context requires otherwise, throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A data converter system with clock signal phase adjustment, the data converter system comprising:
   a first data converter configured to receive a clock signal and to provide a feedback signal, wherein a phase associated with the first data converter is based on the clock signal;
   a second data converter; and
   a clock generator in communication with the first data converter and the second data converter, the clock generator configured to provide the clock signal, the clock generator comprising:
      a feedback signal processor configured to receive the feedback signal from the first data converter and to compute a phase control signal based on the feedback signal; and
      a clock generating circuit configured to adjust the phase of the clock signal based on the phase control signal for synchronizing the first data converter with the second converter at corresponding nodes of the first data converter and the second data converter.

2. The data converter system of claim 1, wherein the feedback signal comprises information indicative of the phase associated with the device.

3. The data converter system of claim 2, wherein the feedback signal processor comprises:
   a phase processor configured to generate a digital signal indicative of the phase associated with the device based on the feedback signal; and
   a calculation circuit configured to compute the phase control signal based on the digital signal.

4. The data converter system of claim 1, wherein the phase processor comprises a time-to-digital converter configured to generate a digital signal representative of a phase difference between the feedback signal and another clock signal.

5. The data converter system of claim 1, wherein the clock generator is further configured to receive a second feedback signal from the second data converter and to adjust a phase of a second clock signal provided to the second data converter based on the second feedback signal.

6. The data converter system of claim 1, wherein the second data converter is configured to receive a second clock signal from the clock generator and to provide a second feedback signal to the clock generator, wherein the feedback signal processor comprises a calculation circuit configured to compute the phase control signal based on the feedback signal and the second feedback signal.

7. The data converter system of claim 1, further comprising two other data converters configured to receive respective clock signals from the clock generator and to provide respective feedback signals to the clock generator, wherein the clock generator is configured to adjust a phase of the respective clock signal of at least one of the two other data converters based on the feedback signal from another of the two other data converters.

8. The data converter system of claim 1, wherein the clock signal is a device clock signal, wherein the clock generator is in communication with the first data converter by way of a bi-directional signal line, and wherein the clock generator comprises a bi-directional interface connected to the bi-directional signal line, the bi-directional interface being configured to receive the feedback signal from the device and to provide a system reference signal to the device.

9. The data converter system of claim 1, wherein the clock signal is a device clock signal, and wherein the clock generator is configured to provide a system reference signal to the device.

10. The data converter system of claim 1, wherein the feedback signal comprises data information associated with the device.

11. The data converter system of claim 1, wherein the feedback signal processor comprises a calculation circuit configured to compute the phase control signal based on information indicative of temperature.

12. The data converter system of claim 1, wherein the clock generating circuit comprises a phase-locked loop configured to receive the phase control signal and to adjust the phase of the clock signal.

13. The data converter system of claim 1, wherein the clock generating circuit comprises a clock signal path configured to receive the phase control signal and to adjust a delay in the clock signal path to adjust the phase of the clock signal.

14. The data converter system of claim 1, wherein the corresponding nodes of the first data converter and the second data converter are sampling nodes.

15. A feedback signal processor for providing a phase control signal for adjusting a phase of a clock signal, the feedback signal processor comprising:
a phase processor comprising a time-to-digital converter, the phase processor configured to:
receive a feedback signal generated by a device that is configured to receive a clock signal; and
generate a digital signal indicative of a phase of the feedback signal relative to a phase of another signal, wherein the phase of the feedback signal depends on the clock signal; and
a calculation circuit configured to compute a phase control signal based on the digital signal and to output the phase control signal for adjusting the phase of the clock signal.

16. The feedback signal processor of claim 15, wherein the calculation circuit is configured to compute the phase control signal based on additional information.

17. The feedback signal processor of claim 16, wherein the additional information comprises at least one of temperature information or information associated with another feedback signal from another device.

18. A clock generator comprising:
the feedback signal processor of claim 15; and
a clock generating circuit configured to adjust the phase of the clock signal and to output the clock signal with the adjusted phase to the device;
wherein the clock generator is configured to generate a second clock signal for a second device such that the device and the second device are synchronized at corresponding nodes within the device and the second device.

19. The clock generator of claim 18, wherein the device is a data converter and the second device is a second data converter, and wherein the clock generator is configured to output the second clock signal to the second data converter and provide a system reference signal that is source synchronous with the second clock signal to the second data converter.

20. The clock generator of claim 18, wherein the clock generator is configured to provide other clock signals to other devices and to adjust a phase of at least one of the other clock signals based on feedback from at least one of the other devices.

21. A clock generator system with clock signal phase adjustment, the clock generator system comprising:
a first clock generator comprising:
means for generating a phase control signal based on feedback from a device configured to receive a clock signal from the clock generator system;
a clock generating circuit configured to generate the clock signal, adjust a phase of the clock signal based on the phase control signal, and output the clock signal having an adjusted phase; and
a second clock generator configured to receive a feedback signal from the first clock generator, the second clock generator comprising:
a second clock generating circuit configured to generate a second clock signal, adjust a phase of the second clock signal based on the feedback signal from the first clock generator, and output the second clock signal having a second adjusted phase.

22. The clock generator system of claim 21, wherein the clock generator system is configured to provide other clock signals to other devices and to adjust a phase of each of the other clock signals based on device feedback signals received from the other devices.

* * * * *